United States Patent
van der Wel et al.

(10) Patent No.: US 10,447,550 B2
(45) Date of Patent: Oct. 15, 2019

(54) SYSTEM AND METHOD ALLOWING FOR DETERMINING RELATIVE POSITIONS OF SLAVE UNITS ALONG A STUB BUS

(71) Applicant: NXP B.V., Eindhoven (NL)

(72) Inventors: Arnoud Pieter van der Wel, Vught (NL); Joop Petrus Maria van Lammeren, Beuningen (NL); Luc van Dijk, Kranenburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/935,051

(22) Filed: Mar. 25, 2018

(65) Prior Publication Data

US 2018/0375738 A1 Dec. 27, 2018

(30) Foreign Application Priority Data

Jun. 21, 2017 (EP) .................................. 17177251

(51) Int. Cl.
*H04W 4/00* (2018.01)
*H04L 12/24* (2006.01)
(Continued)

(52) U.S. Cl.
CPC .............. *H04L 41/12* (2013.01); *G01R 19/10* (2013.01); *G01R 19/2513* (2013.01); *G06F 13/4247* (2013.01); *H04L 12/40013* (2013.01); *H04L 12/40032* (2013.01); *H04L 12/40039* (2013.01); *H04L 12/40045* (2013.01); *G06F 2213/0052* (2013.01); *H04L 61/2038* (2013.01);
(Continued)

(58) Field of Classification Search
None
See application file for complete search history.

(56) References Cited

U.S. PATENT DOCUMENTS

| | | | |
|---|---|---|---|
| 6,838,999 | B1 | 1/2005 | Roepke |
| 7,091,876 | B2 | 8/2006 | Steger |
| (Continued) | | | |

FOREIGN PATENT DOCUMENTS

| | | |
|---|---|---|
| DE | 19940700 A1 | 3/2001 |
| EP | 1490772 B1 | 6/2005 |
| (Continued) | | |

OTHER PUBLICATIONS

EP 2007077 A1, Methold of detecting the position of slave devices in a series connection and slave device fro a series connection, Dec. 24, 2008, pp. 1-8, English Machine Translation.*

*Primary Examiner* — Phuongchau Ba Nguyen
(74) *Attorney, Agent, or Firm* — Rajeev Madnawat

(57) ABSTRACT

The present application relates to a system and a method for determining relative positions slave units along a stub bus with at least a power line and a ground line. Each slave unit is operable in different power modes, which are differentiated by effective resistances between the power and ground lines. A reference voltage potential drop is determined for each slave unit while the slave units are operating in a first power mode. A positioning voltage potential drop is determined for one or more slave units while a selected slave unit is operating in a second power mode. Relative positions of the slave units are determined based on the relative voltage potential drops obtained from the reference and positioning voltage potential drops.

13 Claims, 12 Drawing Sheets

(51) Int. Cl.
  *G06F 13/42* (2006.01)
  *H04L 12/40* (2006.01)
  *G01R 19/10* (2006.01)
  *G01R 19/25* (2006.01)
  *H04L 29/12* (2006.01)

(52) U.S. Cl.
  CPC ............... *H04L 2012/40234* (2013.01); *H04L 2012/40273* (2013.01)

(56) References Cited

U.S. PATENT DOCUMENTS

| | | |
|---|---|---|
| 8,060,658 B2 | 11/2011 | McFarland |
| 2005/0125579 A1 | 6/2005 | Bui et al. |

FOREIGN PATENT DOCUMENTS

| | | | | |
|---|---|---|---|---|
| EP | 2007077 A1 * | 12/2008 | ....... | H04L 12/40006 |
| EP | 2007077 A1 | 12/2008 | | |
| EP | 2571200 A2 | 3/2013 | | |
| WO | 2015/158917 A1 | 10/2015 | | |

\* cited by examiner

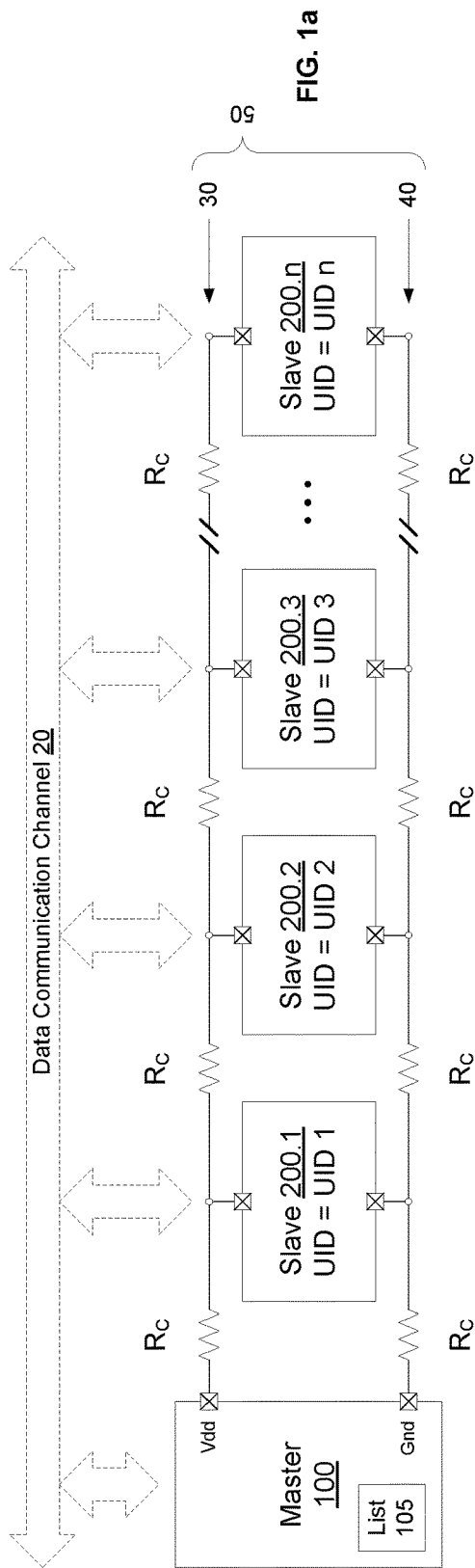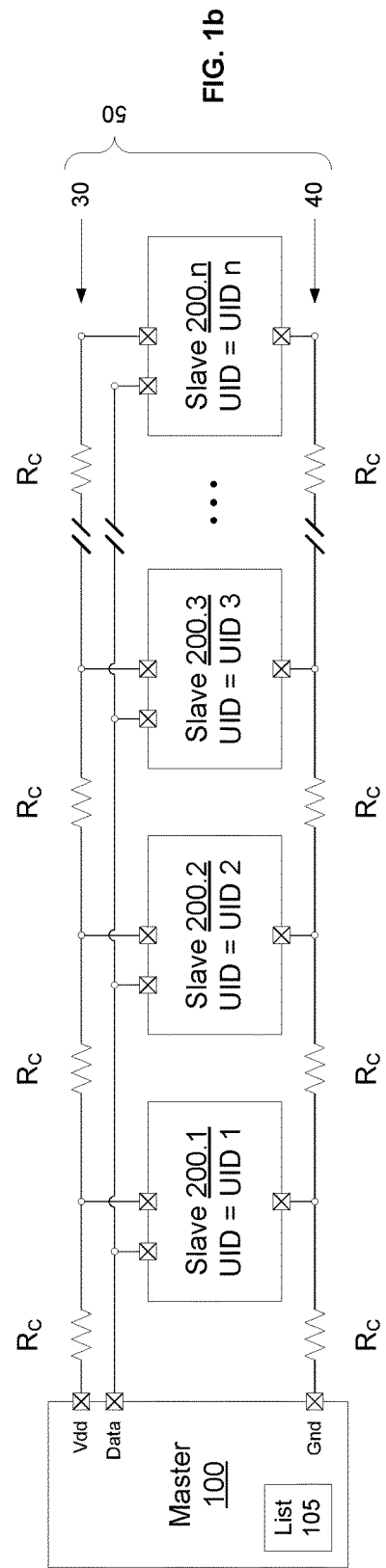

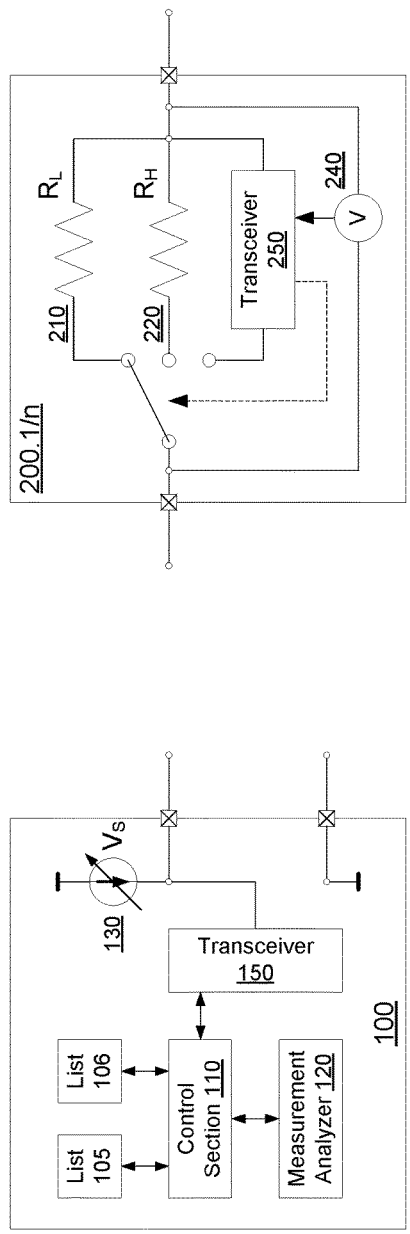
FIG. 3a
FIG. 3b
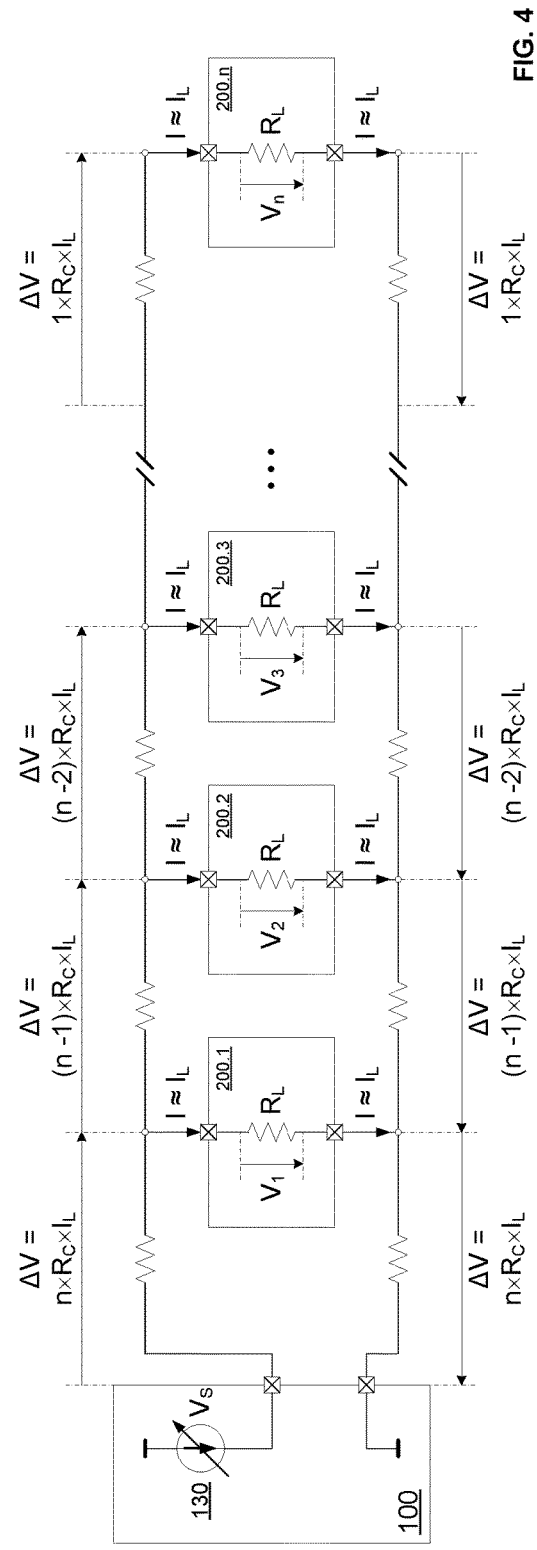
FIG. 4

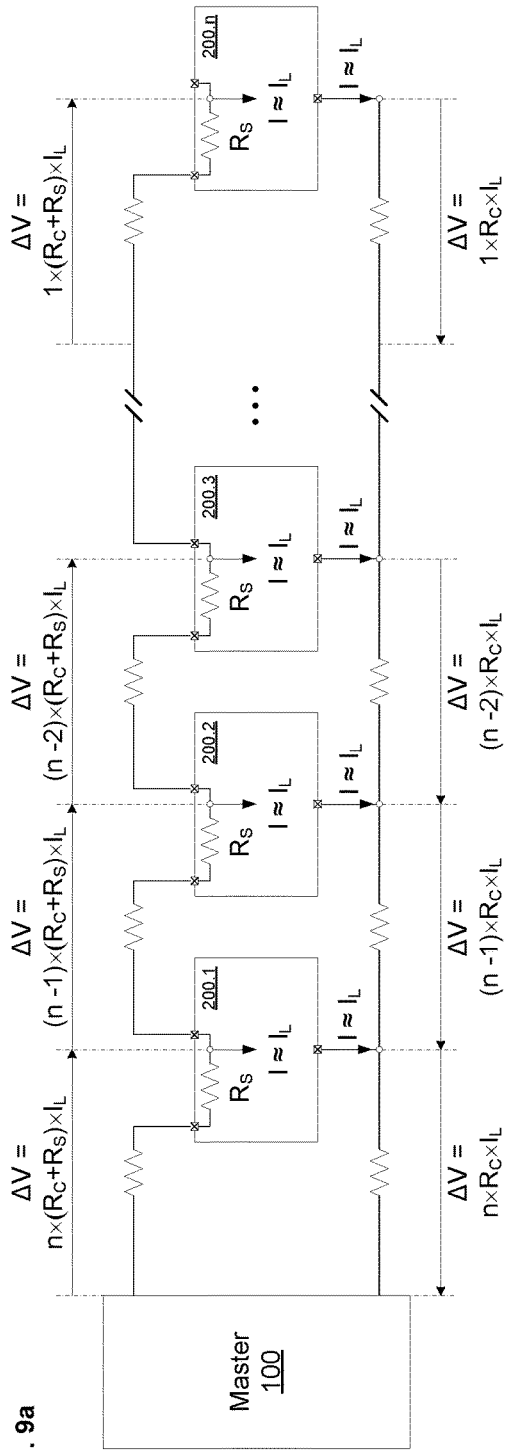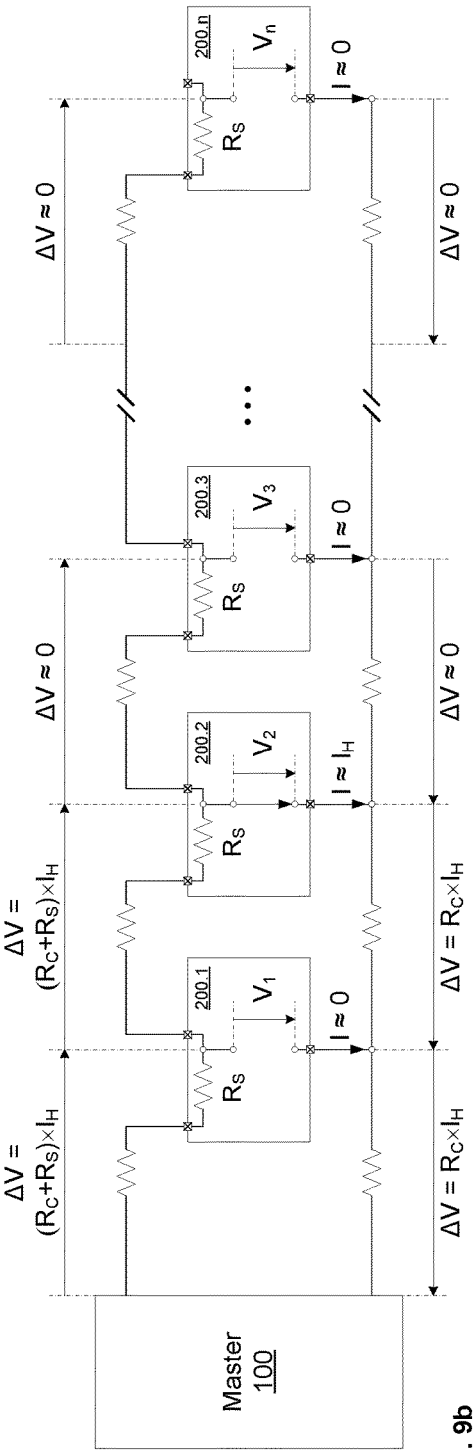
FIG. 9a
FIG. 9b

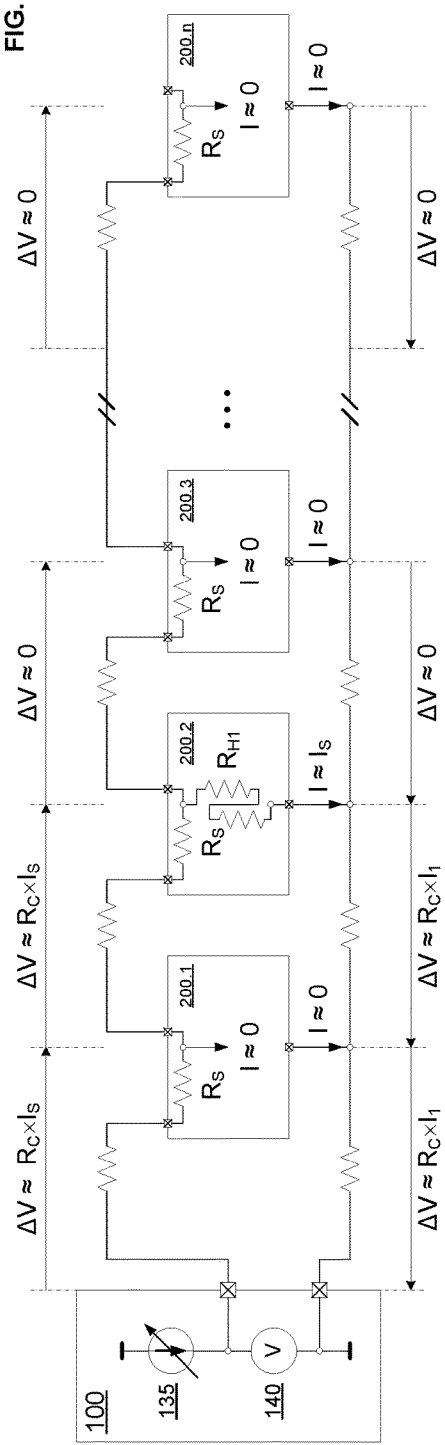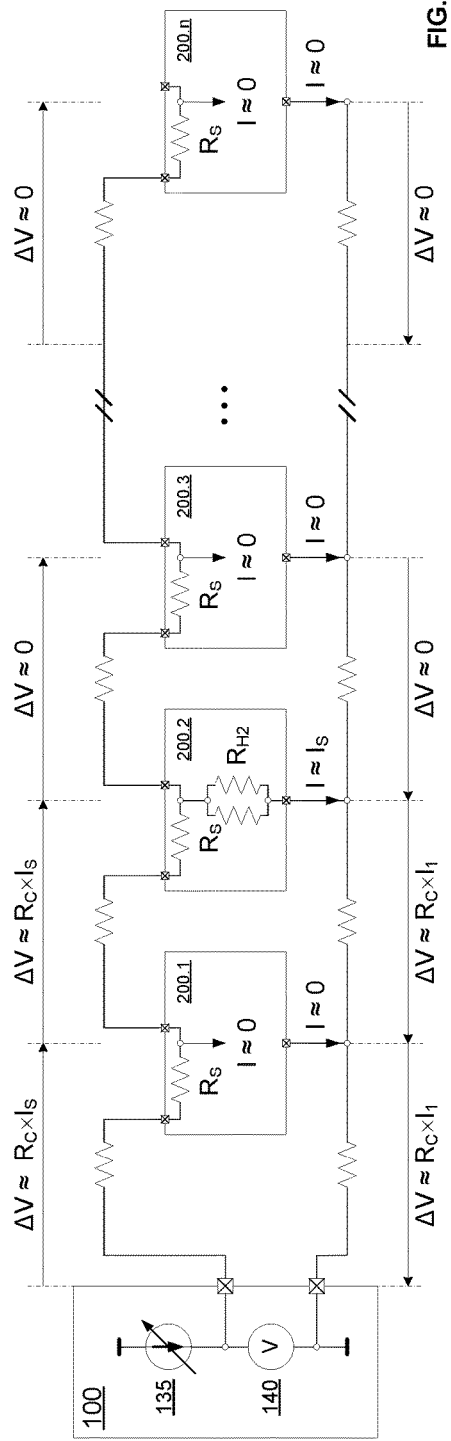

SYSTEM AND METHOD ALLOWING FOR DETERMINING RELATIVE POSITIONS OF SLAVE UNITS ALONG A STUB BUS

CROSS-REFERENCE TO RELATED APPLICATIONS

This application claims the priority under 35 U.S.C. § 119 of European Patent application No. 17177251.0, filed on Jun. 21, 2017, the contents of which are incorporated by reference herein.

FIELD OF THE INVENTION

The present disclosure relates generally to the field of bus systems comprising a control unit, a bus connected to the control unit, and a plurality of addressable participants connected to the bus. More in particular, the invention relates to a method for addressing the control unit participating in the communication on the bus system and to such a bus system.

BACKGROUND

For minimizing the wiring complexities, it is common practice to transmit control signals for electronic control unit via a bus, to which, besides a central unit, the electric control units are connected as individually addressable participants. In vehicle applications, such wired based bus systems may be for instance used for the actuator and/or sensor based control units of a vehicle air conditioner, a window lift, front seats or ultrasonic distance measuring sensors just to mention a limited number of exemplary use cases. To enable the central unit to selectively communicate to one or to a plurality of control units participating on a bus system, addresses are assigned to said control units. Typically, several control units with the same functionality. Such functional identical control units are only individualized by the unique addresses on the bus systems, to which the functional identical control units are connected.

In the state of the art, various procedures and processes are known to assign addresses to control units on a bus system. Such addresses may be assigned to the control units participating on a bus in that they are stored by programming, assigned via daisy chain, plug or PIN coding, or by sequential connection of the control units and allocation of the addresses after connection of a control unit.

SUMMARY

The present invention provides a method for determining relative positions of a plurality of slave units and a system allowing to determine relative positions of a plurality of slave units as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

FIG. 1 schematically illustrates a block diagram of variants of a communication network with stub bus according to examples of the present application according to examples of the present invention;

FIG. 3a schematically illustrates a block diagram of a master unit according to an example of the present invention;

FIG. 3b schematically illustrates a block diagram of a slave unit according to an example of the present invention;

FIG. 4 schematically illustrates a block diagram of a communication network with slave units operating in low-power mode according to an example of the present application;

FIG. 9a schematically illustrates a block diagram of a communication network with slave units operating in low-power mode according to an example of the present application;

FIG. 9b schematically illustrates a block diagram of a communication network with a slave unit of FIG. 8 operating in high-power mode and the remaining slave units operating in low-power mode according to an example of the present application;

FIG. 14a schematically illustrates a block diagram of a communication network with slave units operating in low-power mode except a selected one operating in a first high-power mode according to an example of the present application; and FIG. 14b schematically illustrates a block diagram of a communication network with slave units operating in low-power mode except a selected one operating in a second high-power mode according to an example of the present application.

DETAILED DESCRIPTION

Figure 2:
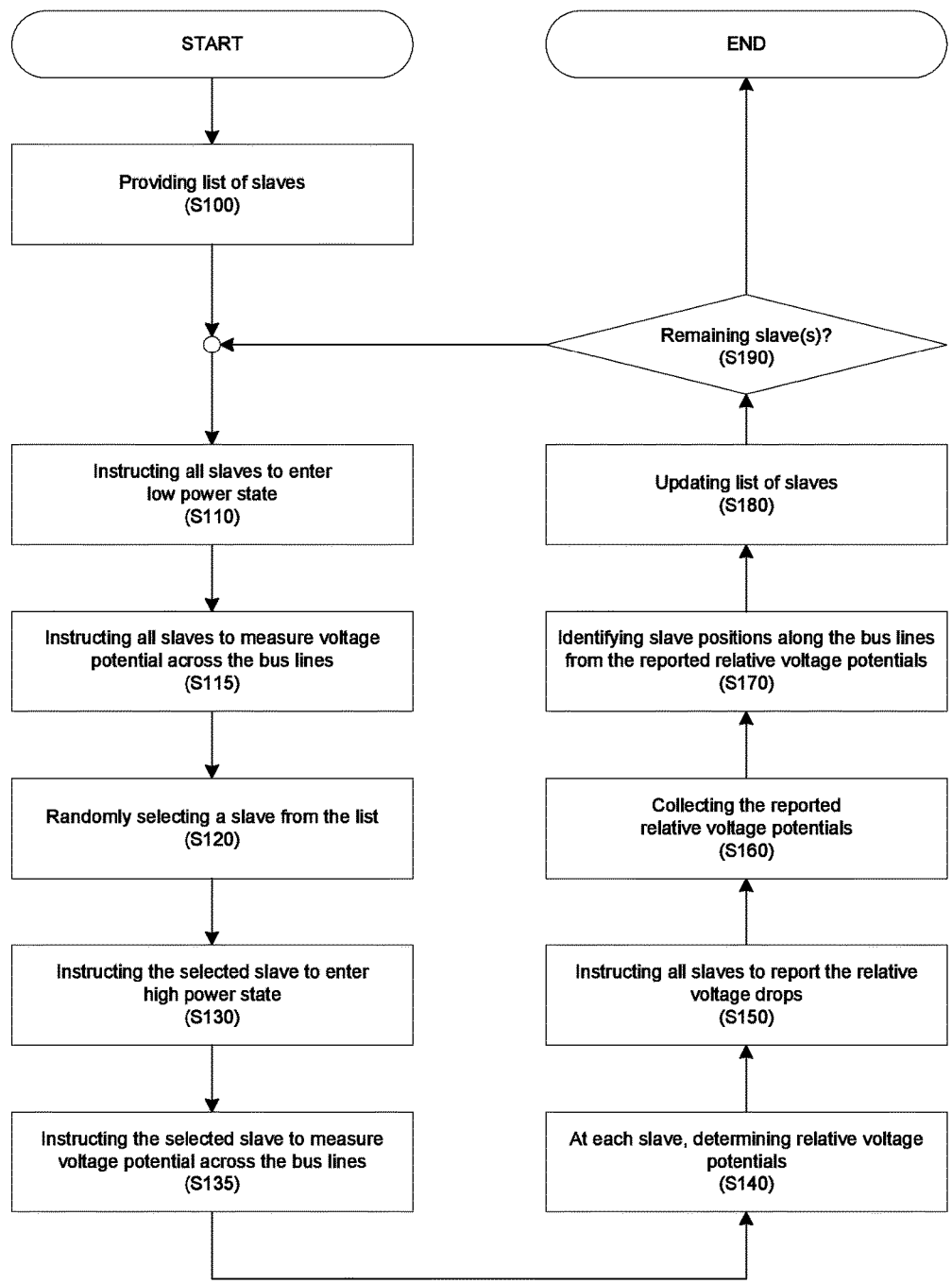
FIG. 2 schematically illustrates a flow diagram of a method for determining the relative arrangement/position of slave units along a stub bus of a communication network according to an example of the present invention.

Embodiments of the present disclosure will be described below in detail with reference to drawings. Note that the same reference numerals are used to represent identical or equivalent elements in figures, and the description thereof will not be repeated. The embodiments set forth below represent the necessary information to enable those skilled in the art to practice the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

In modern vehicles, various bus systems may be used. For example, these are CAN (Controller Area Network), Flexray and the LIN (Local Interconnect Network), also referred to LIN bus. The LIN is a communication system, which was developed for the communication of intelligent sensors and actors in vehicles at low cost, is based on a single wire bus and may be classified as a field bus. A typical application scenario is the networking within a vehicle door, of a seat, of air conditioning flaps or the various light sources of an interior lighting system. LIN is typically applied where the higher bandwidth and the higher versatility of CAN is not required. The LIN specification includes the LIN protocol, a unified format for the description of the overall LIN and the interface between a LIN and the respective application.

Referring now to FIG. 1, block diagrams of variants of a communication network with stub bus according to examples of the present application are schematically illustrated.

In one example, the illustrated communication network is a Local Interconnect Network (LIN). A LIN is composed of a master unit 100, which may be also referred to as central control unit, one or more slave units 200.1 to 200.n, which may be also referred to as nodes or node units, and a bus. The master unit 100 is for instance a central controller in a vehicle, such as for controlling the lighting and/or the air conditioning in the vehicle, such as a HVAC (Heating, Ventilation and Air conditioning) controller or a BCM (Body Control Module) of a vehicle. The slave units for example include a controller and an LED (light emitting diode), a controller and an air conditioning flap, a controller and an actuator or a controller and a sensor.

The master unit 100 is connected to a multi-wire bus, e.g. a two-wire bus. The bus 50 is a stub bus. The slave units 200.1 to 200.n are connected along the bus 50. The arrangement/position of the slave units 200.1 to 200.n along the bus 50 will be described in the following from the perspective of the master unit 100, starting from which the slave units 200.1 to 200.n are connected to the bus in consecutive arrangement in downstream direction. For the sake of understanding, the relative arrangement/position of the slave unit 200.i will be described as being upstream to the slave unit 200.i+1 and the relative arrangement/position of the slave unit 200.i+1 will be described as being downstream to the slave unit 200.i. The "first" slave unit along the bus 50 is the slave unit 200.1 and the "last" slave unit along the bus 50 is the slave unit 200.n, wherein n is a positive integer. An arbitrary slave unit from among the slave units 200.1 to 200.n is referred to as slave unit 200.i, wherein $1 \leq i \leq n$.

The bus 50 comprises at least a power supply line 30 and a ground line 40, to which the slave units 200.1 to 200.n are connected.

A data communication channel 20 is established between the master unit 100 and the slave units 200.1 to 200.n. In regular operation, the master unit 100 (acting as a bus master) has knowledge about and control over the scheduling of the communication between the master unit 100 and slave units 200.1 to 200.n. A slave unit 110 (the reference number 110 refers to any one of the reference numbers 200.1 to 200.n) may transmit data upon when the master unit 100 has requested it to do that. The master unit 100 may request the data transmission by sending a header, which is marked with an address specific of the requested slave unit 200.i on the bus. In response, the addressed node 200.i supplies the data to be transmitted to the bus. Each node 200.1 to 200.n has a network specific address, via which it is addressed by the master unit 100.

The network specific addresses are assigned in the auto-addressing procedure, which, for instance, is carried out once in case at least one slave unit without network specific address is connected to the bus for the first time. In particular, the auto-addressing procedure is carried out after the assembly of the communication network and/or at initial operation of the units arranged to form the communication network. Further, the auto-addressing procedure may be carried out on a regular basis, e.g. each time a unit of the communication network is put into operation.

For performing the auto-addressing procedure, each of the slave units 200.1 to 200.n are addressable by the master unit 100 using a unit specific identifying address, or unit identifier UID, herein referred to as UID 1, UID 2, . . . UIDn assigned to the respective one of the slave units 200.1 to 200.n. The unit identifier UID is for instance embedded within a slave unit at the manufacturing stage for use during auto-addressing procedure. The embedded unit identifier UID is unique to allow for distinguishing between functional identical slave units. It is immediately understood that such embedded unit identifiers UIDs are not applicable for regular operation but for performing communication between the master unit 100 and the slave units 200.1 to 200.n during performing the auto-addressing procedure.

The master unit 100 is arranged to discover the unit identifiers UIDs of the slave units 200.1 to 200.n connected to the bus 50. Such discovery process is known in the art. In an example, the master unit 100 performs a binary search for the unit identifiers UIDs of the connected slave units 200.1 to 200.n. In another example, the master unit 100 may request to slave unit 200.1 to 200.n to transmit their unit identifiers UIDs. The unit identifiers UIDs of the slave units 200.1 to 200.n are provided e.g. in form of a list 105, at the master unit 100.

The auto-addressing procedure according to an embodiment of the present application is based on determining the individual cable resistances of the bus line sections between the master unit 100 and the slave units 200.1 to 200.n. An individual cable resistance is indicative of the length of the bus lines 30, 40 between the master unit 100 and a respective one of the slave units 200.1 to 200.n. The relative arrangement/positions of the slave units 200.1 to 200.n along the bus 50 can be determined from a comparison of the individual cable resistances determined for each of the slave units 200.1 to 200.n.

As schematically illustrated in FIG. 1, an equivalent resistor $R_c$ can be used for describing the cable resistances between two adjacent units 100, 200.1 to 200.n. Those skilled in the art are aware that a cable resistance is a function of the length. From the following description, the skilled person will appreciate that the simplifying assumption of a constant cable resistance between two adjacent units 100, 200.1 to 200.n does not limit the teaching of the present application thereto but is made merely for the sake of intelligibility and understanding. In particular, the auto-addressing procedure disclosed in the present application is based on a basic concept for reliably determining the cable resistances between the master unit 100 and the slave units 200.1 to 200.n, based on which the relative positioning of the slave units 200.1 to 200.n along the bus 50 can be deduced.

In the example shown in FIG. 1a, the illustrated communication network uses power line communication for communicating data between the master unit 100 and the slave units 200.1 to 200.n. The data signal is for instance carried on the power supply line 30 connecting the master unit 100 and the slave units 200.1 to 200.n. In the example shown in FIG. 1b, the illustrated communication network uses one or more dedicated data line(s) between the master unit 100 and the slave units 200.1 to 200.n for communicating data signal between them. For instance, the data signals communicated between the connected units 100, 200.1 and 200.n may be carried on a single wire or on a two-wire twisted pair for differential signaling. It should be noted that the auto-addressing procedure according to embodiments described in the following is applicable with both illustrated communication networks but not limited thereto.

The auto-addressing procedure according to an embodiment of the present application will be further described with regard to FIG. 2, which schematically illustrates a flow diagram of a method for determining the relative arrangement/position of slave units along a stub bus of a communication network. The auto-addressing procedure is controlled by the master unit, which is arranged at one end of the stub bus, to which an arbitrary number of slave units is connected. The auto-addressing procedure will be further described with reference to FIG. 3a, which schematically illustrates a block diagram of a master unit 100, and with reference to FIG. 3b, which schematically illustrates a block diagram of any slave unit 200.1 to 200.n.

The master unit 100 according to an example of the present application as exemplified in FIG. 3a comprises a voltage adjustable power source 130 and a transceiver 150 for communication network using power line communication on a two wire stub bus for data communication between the master unit 100 and slave units 200.1 to 200.n connected to the stub bus. The master unit 100 further comprises a control section 110, which is connected to the transceiver for instructing the slave units 200.1 to 200.n and receiving measurement data from the slave units 200.1 to 200.n, a measurement data analyzer section 120 and at least a list of slave units 105 and 106 for maintaining information about the slave units 200.1 to 200.n.

Each slave unit 200.1 to 200.n according to an example of the present application as exemplified in FIG. 3a is instructable by the master unit 100 to operate in a low-power mode and a high-power mode. A slave unit being instructed to operate in the low-power mode, draws a low-power current from the power supply line, which is smaller than a high-power current, which is drawn by the slave unit being instructed to operate in the high-power mode. The low-power mode is schematically illustrated by a switchable resistor $R_L$ 210 and the high-power mode is schematically illustrated by a switchable resistor $R_H$ 220. The switchable resistors $R_L$ 210 and $R_H$ 220 illustrate the effective resistances of the slave units 200.1 to 200.n across which the voltage potential drops are measured in the respective (low and high) power modes. The resistor $R_L$ 210 should be understood to have a higher effective resistance than the resistor $R_H$ 220.

Each slave unit 200.1 to 200.n further comprises a transceiver 250 for receiving instructions from the master unit 100 and transmitting measurement related data to the master unit 100. Each slave unit 200.1 to 200.n is further provided with a voltage potential drop measurement unit 240, which is arranged to detect a voltage potential drop between a power supply line connector and a ground line connector. The voltage potential drop measurement unit 240 is further connected to the transceiver 120 for reporting the measurement related data to the master unit 100.

Referring back to FIG. 2, a list of slave units connected to the bus is provided/maintained at a master unit 100, in an operation S100. The list of slave units comprises all slave units connected to the bus. Initially, the arrangement/positions of slave units along the bus is/are unknown. A slave unit, which arrangement/position along the bus is unknown, will be referred to as undetected or "unpositioned".

In operations S110 and S115, the slave units are instructed by the master unit 100 to enter the low-power mode and the slave units are further instructed by the master unit 100 to each measure a reference voltage potential drop between the power supply line connector and the ground line connector during operating in low-power mode.

In an operation S120, a slave unit is randomly selected from the list of undetected slave units.

In operations S130 and S135, the selected slave unit is instructed by the master unit 100 to enter the high-power mode and the slave units are further instructed by the master unit 100 to each measure a positioning voltage potential drop between the power supply line connector and the ground line connector during the selected slave unit operating in high-power mode and the remaining slave units operating in low-power mode.

In an operation S140, a relative voltage potential drop is determined by each slave unit on the basis of the measured reference and positioning voltage potential drop.

In an operation S150, the master unit requests the slave units to report the determined relative voltage potential drops, in response to which each slave unit transmits the determined relative voltage potential drops together with its unique identifier (UID), which enables the master unit to associate each determined relative voltage potential drop with a specific slave unit having assigned a respective UID. The determined relative voltage potential drops reported by the slave units are collected at the master unit in an operation S160. Based on the collected relative voltage potential drops, the master unit determines relative positions of at least a set of the slave units based on the relative levels of the collected relative voltage potential drops in an operation S170.

In an operation S180, the list of undetected slave units is updated with respect to the set of slave units, of which the relative positions along the stub bus have been determined on the basis of the relative levels of the collected relative voltage potential drops. For instance, slave units with now known position/arrangement along the stub bus are removed from the list or indicated to be ignored for the further process of the auto-addressing procedure.

In an operation S190, the master unit determines whether or not remaining slave units with unknown position/arrangement are still present. If there are remaining undetected slave units, the auto-addressing procedure returns to the operation S110. Otherwise, if the position/arrangement of all slave units connected to the stub bus is determined, the auto-addressing procedure is completed.

The reference voltage potential drop measurement performed at the slave units $200.1$ to $200.n$ will be more fully described with reference to FIG. 4, which schematically illustrates a block diagram of a communication network with slave units operating in low-power mode according to an example of the present application.

As described above, the master unit instructs all slave units connected to the stub bus to enter the low-power mode, in which reference voltage potential drops are determined by each of the slave units $200.1$ to $200.n$.

The reference voltage potential drop $V_1^{ref}$, which is measured by the slave unit $200.1$ can be determined as follows:

$$V_S \approx R_c \cdot n \cdot I_L + V_1^{ref} + R_c \cdot n \cdot I_L$$

$$= 2 \cdot R_c \cdot n \cdot I_L + V_1^{ref}$$

wherein $V_s$ is the voltage supplied by the voltage controlled adjustable source 130, $R_c$ is the resistance of a line section of the power supply line or the ground line between two neighboring units (e.g. between the master unit 100 and the first slave unit $200.1$ or between neighboring slave unit $200.i$ and $200.i+1$), $I_L$ is the current flowing through the slave unit $200.1$, and n is the number of slave units $200.1$ to $200.n$.

Without loss of generality, it is assumed that the bus line resistance $R_c$ is substantially the same for all line sections. Without loss of generality, it is further assumed that the effective resistance $R_L$ 220 of the slave units $200.1$ to $200.n$ in low-power mode is high, which results in a low current being substantially the same for all slave units $200.1$ to $200.n$ along the stub bus.

The reference voltage potential drop $V_2^{ref}$, which is measured by the slave unit $200.2$, can be determined as follows:

$$V_S \approx R_c \cdot n \cdot I_L + R_c \cdot (n-1) \cdot I_L + V_2^{ref} + R_c \cdot (n-1) \cdot I_L + R_c \cdot n \cdot I_L$$

$$= 2 \cdot R_c \cdot (n+n-1) \cdot I_L + V_2^{ref}$$

The reference voltage potential drop $V_3^{ref}$, which is measured by the slave unit $200.3$, can be determined as follows:

$$V_S \approx R_c \cdot n \cdot I_L + R_c \cdot (n-1) \cdot I_L + R_c \cdot (n-2) \cdot I_L + V_3^{ref} + R_c \cdot (n-2) \cdot I_L + R_c \cdot (n+1) \cdot I_L + R_c \cdot n \cdot I_L$$

$$= 2 \cdot R_c \cdot (n+n-1+n-2) \cdot I_L + V_3^{ref}$$

In general, the reference voltage potential drop $V_i^{ref}$, which is measured by the slave unit $200.i$, where $1 \leq i \leq n$ and i is a position index starting at the first slave unit $200.1$ arranged downstream the master unit 200 and ending with the last slave unit $200.n$ having the maximum distance from the master unit 200, can be determined as follows:

$$V_S \approx R_c \cdot \left(i \cdot n - \frac{i^2 - i}{2}\right) \cdot I_L + V_i^{ref} + R_c \cdot \left(i \cdot n - \frac{i^2 - i}{2}\right) \cdot I_L$$

$$= 2 \cdot R_c \cdot \left(i \cdot n - \frac{i^2 - i}{2}\right) \cdot I_L + V_i^{ref}$$

Figure 6:
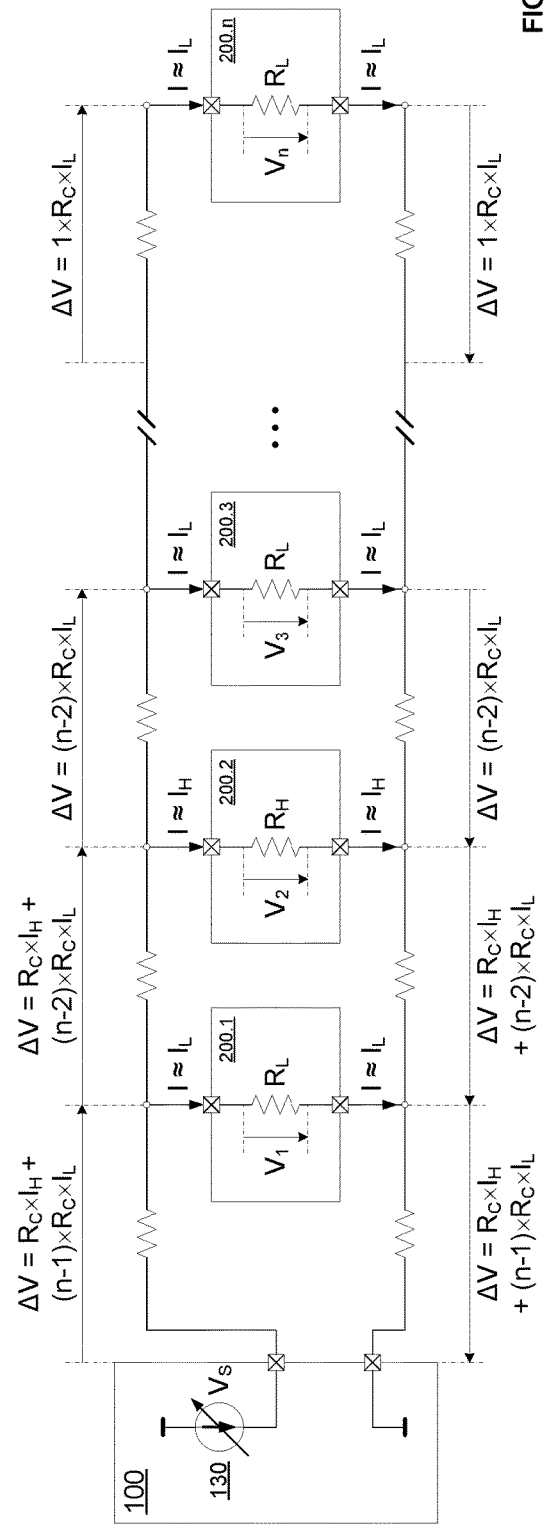
FIG. 6 schematically illustrates a block diagram of a communication network with a slave unit operating in high-power mode and the remaining slave units operating in low-power mode according to an example of the present application.

The positioning voltage potential drop measurement performed at the slave units $200.1$ to $200.n$ will be more fully described with reference to FIG. 6, which schematically illustrates a block diagram of a communication network with a slave unit operating in high-power mode and the remaining slave units operating in low-power mode according to an example of the present application.

As described above, the master unit instructs selected slave unit connected to the stub bus to enter the high-power mode and the remaining slave units connected to the stub bus to enter low-power mode and the master unit instructs each of the slave units $200.1$ to $200.n$ operating in the respectively instructed power mode to determine positioning voltage potential drops.

Figure 5A:
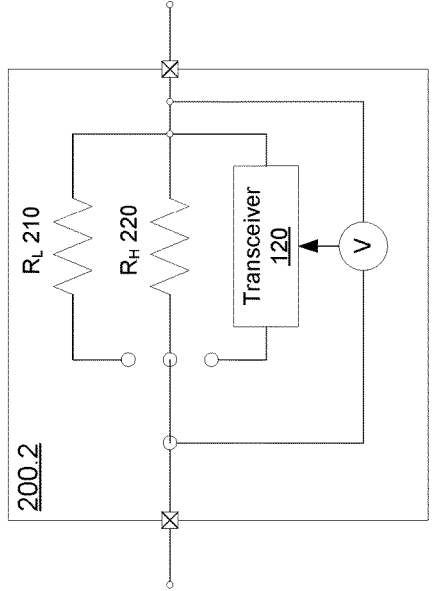
FIG. 5 schematically illustrates block diagrams of a slave unit operating in the low-power mode and in high-power mode, respectively, according to an example of the present application.
Figure 5B:
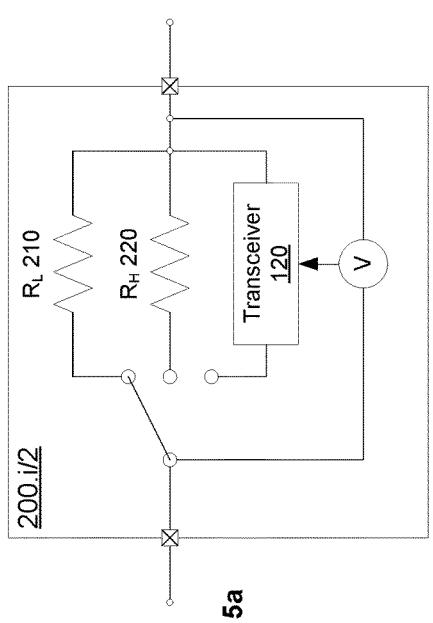

The selected slave unit is an arbitrarily selected slave unit out of the list of undetected slave units. For the sake of explanation, the slave unit $200.2$ is assumed to be selected. Respective switching states of the slave units are schematically illustrated in FIGS. 5a and 5b. FIG. 5a schematically illustrates a block diagram of a slave unit operating in the low-power mode according to an example of the present application. FIG. 5b schematically illustrates a block diagram of a slave unit operating in the high-power mode according to an example of the present application.

The reference voltage potential drop $V_1^{pos}$, which is measured by the slave unit $200.1$, can be determined as follows:

$$V_S \approx R_c \cdot (n-1) \cdot I_L + R_c \cdot I_H + V_1^{pos} + R_c \cdot (n-1) \cdot I_L + R_c \cdot I_H$$

$$= 2 \cdot R_c \cdot (n-1) \cdot I_L + 2 \cdot R_c \cdot I_H + V_1^{pos}$$

wherein $V_s$ is the voltage supplied by the voltage adjustable power source 130, $R_c$ is the resistance of a line section of the power supply line or the ground line between two neighboring units, and $I_L$ is the current flowing through the slave units $200.1$ and $200.3$ to $200.n$, which are operating in low-power mode, $I_H$ is the current flowing through the slave unit $200.2$, which is operating in high-power mode, and n is the number of slave units $200.1$ to $200.n$.

Without loss of generality, it is assumed that the bus line resistance $R_c$ is substantially the same for all line sections. Without loss of generality, it is further assumed that the effective resistance $R_L$ 220 of the slave units $200.1$ and $200.3$ to $200.n$ in low-power mode is high in comparison to the effective resistance $R_H$ 201 of the slave unit $200.2$, which results in a low current being substantially the same for slave units $200.1$ and $200.3$ to $200.n$ operating in low-power mode.

The reference voltage potential drop $V_2^{pos}$, which is measured by the slave unit $200.2$, can be determined as follows:

$$V_S \approx R_c \cdot (n-1) \cdot I_L + R_c \cdot I_H + R_c \cdot (n-2) \cdot I_L + R_c \cdot I_H + V_2^{pos} + R_c \cdot (n-2) \cdot I_L + R_c \cdot I_H + R_c \cdot (n-1) \cdot I_L + R_c \cdot I_H$$

$$= 2 \cdot R_c \cdot (n-1+n-2) \cdot I_L + 4 \cdot R_c \cdot I_H + V_2^{pos}$$

In general, the slave unit 200.$k$ may be selected, where $1 \leq k \leq n$, and n is the total number of slave units 200.1 to 200.$n$ and the slave unit 200.$p$. The reference voltage potential drop $V_p^{pos}$, which is measured by the slave unit 200.$p$, where $1 \leq p \leq k$, can be determined as follows:

$$V_S \approx R_c \cdot \left( p \cdot n - \frac{p^2 + p}{2} \right) \cdot I_L + p \cdot R_c \cdot I_H + V_p^{pos} + R_c \cdot$$

$$\left( p \cdot n - \frac{p^2 + p}{2} \right) \cdot I_L + p \cdot R_c \cdot I_H$$

$$= 2 \cdot R_c \cdot \left( p \cdot n - \frac{p^2 + p}{2} \right) \cdot I_L + 2 \cdot p \cdot R_c \cdot I_H + V_p^{pos}$$

The reference voltage potential drop $V_3^{pos}$, which is measured by the slave unit 200.3, can be determined as follows (wherein the selected slave is the slave 200.2, where k=2):

$$V_S \approx R_c \cdot (n-1) \cdot I_L + R_c \cdot I_H + R_c \cdot (n-2) \cdot I_L + R_c \cdot I_H + R_c \cdot (n-2) \cdot I_L +$$
$$V_3 + R_c \cdot (n-2) \cdot I_L + R_c \cdot (n-2) \cdot I_L + R_c \cdot I_H + R_c \cdot (n-1) \cdot I_L +$$
$$R_c \cdot I_H$$

$$= 2 \cdot R_c \cdot (n-1+n-2+n-2) \cdot I_L + 4 \cdot R_c \cdot I_H + V_3^{pos}$$

In general, the slave unit 200.$k$ may be selected, where $1 \leq k \leq n$ and n is the total number of slave units 200.1 to 200.$n$. The reference voltage potential drop $V_q^{pos}$, which is measured by the slave unit 200.$q$, where $k+1 \leq q \leq n$, can be determined as follows:

$$V_S \approx R_c \cdot \left( q \cdot n - \frac{q^2 + q}{2} + (q-k) \right) \cdot I_L + k \cdot R_c \cdot I_H + V_q^{pos} + R_c \cdot$$

$$\left( q \cdot n - \frac{q^2 + q}{2} + (q-k) \right) \cdot I_L + k \cdot R_c \cdot I_H$$

$$= 2 \cdot R_c \cdot \left( q \cdot n - \frac{q^2 + q}{2} + (q-k) \right) \cdot I_L + 2 \cdot k \cdot R_c \cdot I_H + V_q^{pos}$$

Figure 7:
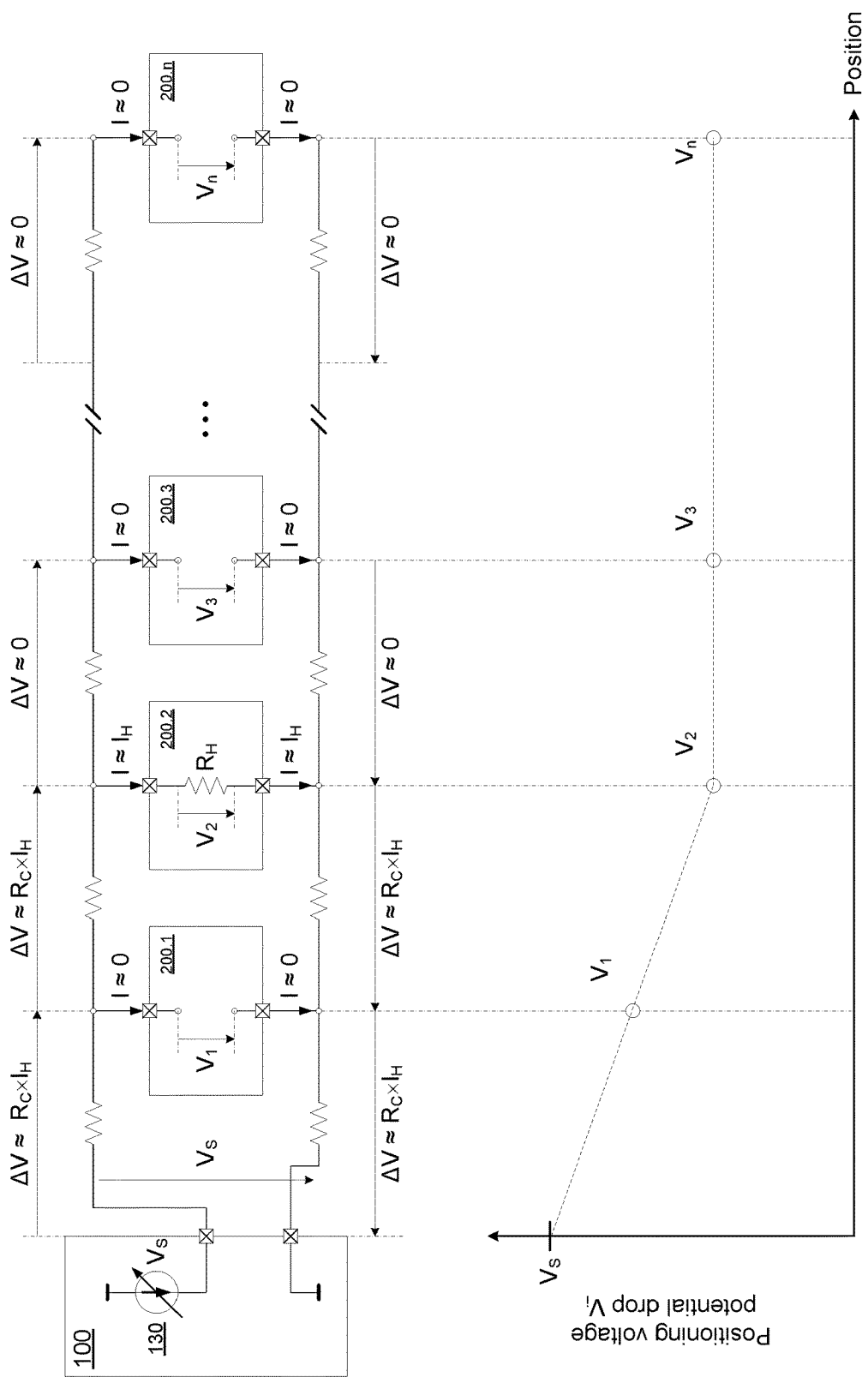
FIG. 7 schematically illustrates a block diagram of a communication network with a selected slave unit operating in high-power mode and the remaining slave units operating in low-power mode according to an example of the present application and a diagram schematically illustrating the course of determined relative voltage potential drops in accordance with the exemplified power modes, in which the slave units operate.

The determining of the relative voltage potential drop by each of the slave units 200.1 to 200.$n$ will be more fully understood with reference to FIG. 7, which schematically illustrates a block diagram of a communication network with a selected slave unit operating in high-power mode and the remaining slave units operating in low-power mode according to an example of the present application and a diagram schematically illustrating the course of determined positioning voltage potential drops in accordance with the exemplified power modes, in which the slave units operate.

The relative voltage potential drop $\Delta V$ is determined based on the reference voltage potential drop and the positioning voltage potential drop each of which measured by each of the slave units 200.1 to 200.$n$.

The reference voltage potential drop $V_i^{ref}$, which is measured by the slave unit 200.$i$, where $1 \leq i \leq n$, can be expressed as follows:

$$V_i^{ref} \approx V_S - 2 \cdot R_c \cdot \left( i \cdot n - \frac{i^2 - i}{2} \right) \cdot I_L$$

In general, the slave unit 200.$k$ may be selected, where $1 \leq k \leq n$.

The positioning voltage potential drop $V_i^{pos}$, which is measured by the slave unit 200.$i$, where k is the selected slave unit 200.$k$, $1 \leq k \leq n$ and n is the number of slave units 200.1 to 200.$n$, can be determined as follows:

$$V_i^{pos} \approx \begin{cases} V_S - 2 \cdot R_c \cdot \left( i \cdot n - \frac{i^2 + i}{2} \right) \cdot I_L - 2 \cdot i \cdot R_c \cdot I_H & 1 \leq i \leq k \\ V_S - 2 \cdot R_c \cdot \left( i \cdot n - \frac{i^2 + i}{2} + (i-k) \right) \cdot I_L - 2 \cdot k \cdot R_c \cdot I_H & k+1 \leq i \leq n \end{cases}$$

The above relation is exemplarily shown in the diagram of FIG. 7, which schematically illustrates the course of the positioning voltage potential drop $V_i^{pos}$ with respect to the slave unit 200.2 being the selected slave unit. In particular, it may be assumed that $I_L \ll I_H$.

The relative voltage potential drop $\Delta V_i$ is obtained by determining a difference of the measured voltage potential drops as follows:

$$\Delta V_i = V_i^{ref} - V_i^{pos}$$
$$\approx V_S - 2 \cdot R_c \cdot \left( i \cdot n - \frac{i^2 - i}{2} \right) \cdot I_L -$$
$$\left[ V_S - 2 \cdot R_c \cdot \left( i \cdot n - \frac{i^2 + i}{2} \right) \cdot I_L - 2 \cdot i \cdot R_c \cdot I_H \right]$$
$$= V_S - V_S + 2 \cdot R_c \cdot \left( i \cdot n - \frac{i^2 + i}{2} - i \cdot n + \frac{i^2 - i}{2} \right) \cdot$$
$$I_L + 2 \cdot i \cdot R_c \cdot I_H$$
$$= 2 \cdot i \cdot R_c \cdot I_H - 2 \cdot i \cdot R_c \cdot I_L$$
$$= 2 \cdot R_c \cdot i \cdot (I_H - I_L)$$

where $1 \leq i \leq k$, and $$\Delta V_i = V_i^{ref} - V_i^{pos}$$
$$\approx V_S - 2 \cdot R_c \cdot \left( i \cdot n - \frac{i^2 - i}{2} \right) \cdot I_L -$$
$$\left[ V_S - 2 \cdot R_c \cdot \left( i \cdot n - \frac{i^2 - i}{2} + (i-k) \right) \cdot I_L - 2 \cdot k \cdot R_c \cdot I_H \right]$$
$$= V_S - V_S + 2 \cdot R_c \cdot \left( i \cdot n - \frac{i^2 - i}{2} + (i-k) - i \cdot n + \frac{i^2 - i}{2} \right) \cdot$$
$$I_L + 2 \cdot i \cdot R_c \cdot I_H$$
$$= 2 \cdot k \cdot R_c \cdot I_H - 2 \cdot k \cdot R_c \cdot I_L$$

where $k+1 \leq i \leq n$.

This means that $$\Delta V_i = \begin{cases} 2 \cdot i \cdot R_c \cdot (I_H - I_L) & 1 \leq i \leq k \\ 2 \cdot k \cdot R_c \cdot (I_H - I_L) & k+1 \leq i \leq n \end{cases}$$

and $$\Delta V_i \approx \begin{cases} 2 \cdot i \cdot R_c \cdot I_H & 1 \leq i \leq k \\ 2 \cdot k \cdot R_c \cdot I_H & k+1 \leq i \leq n \end{cases}$$

when assuming that $I_H \gg I_L$.

Hence, $$\Delta V_i \sim \begin{cases} i \cdot R_c & 1 \le i \le k \\ k \cdot R_c & k+1 \le i \le n \end{cases} \qquad 5$$

wherein k is a constant for each measurement cycle. Therefore, the relative positions/arrangement of the slave units 200.1 to 200.k ($1 \le i \le k$) can be determined by analyzing the levels of the relative voltage potential drop $\Delta V_i$, which is substantially proportional to the position index i.

As the skilled person may understand from the above description, the resistance of the power supply line and/or the ground line may be substantially low. As shown above with respect to the above example, the relative positions/arrangement of the slave units 200.i ($1 \le i \le n$) can be determined by analyzing the levels of the relative voltage potential drop $\Delta V_i$, which is in turn substantially proportional to the resistance $R_c$, which denotes the resistance of a line section of the power supply line or the ground line between two neighboring units (e.g. between the master unit 100 and the first slave unit 200.1 or between neighboring slave unit 200.i and 200.i+1).

This means that the higher the resistance $R_c$ the more distinct are the levels of the relative voltage potential drop $\Delta V_i$ obtained from the measured voltage potential drops. The integration of a shunt resistance to increase the resistance of the power supply line or the ground line enables increasing the level distances.

Figure 8:
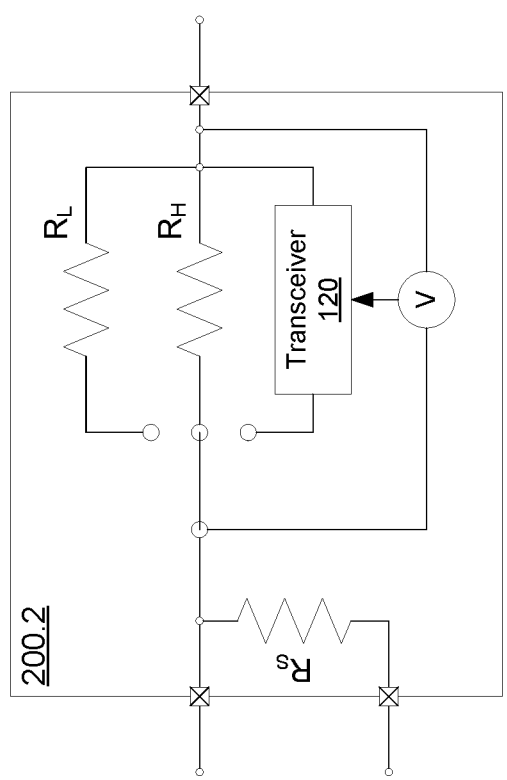
FIG. 8 schematically illustrates a block diagram of a slave unit with a shunt resistance according to another example of the present invention.

Referring to FIG. 8 now, each slave unit 200.i according to an example of the present application comprises a shunt resistance $R_s$, which is for instance arranged in series with the power line. The shunt resistance $R_s$ is arranged downstream to the effective resistances, across which the voltage potential drops are measured. Accordingly, the slave unit $$V_i^{pos} \approx \begin{cases} V_S - (2 \cdot R_c + R_s) \cdot \left(i \cdot n - \frac{i^2 + i}{2}\right) \cdot I_L - (2 \cdot R_c + R_s) \cdot i \cdot I_H & 1 \le i \le k \\ V_S - (2 \cdot R_c + R_s) \cdot \left(i \cdot n - \frac{i^2 + i}{2} + (i-k)\right) \cdot I_L - (2 \cdot R_c + R_s) \cdot k \cdot I_H & k+1 \le i \le n \end{cases}$$

200.i has an input terminal and an output terminal for connecting to the power line. The shunt resistance $R_s$ is connected between the input terminal and the output terminal. Alternatively or additionally, a shunt resistance $R_s$ may be arranged in series with the ground line (not shown). The statements above with respect to the shunt resistance $R_s$ connected in series with the power line apply analogously to a shunt resistance $R_s$ connected in series with the ground line.

Referring now to FIG. 9a, the reference voltage potential drop $V_i^{ref}$, which is measured by the slave unit 200.i, where $1 \le i \le n$ and i is a position index starting at the first slave unit 200.1 arranged downstream the master unit 200 and ending with the last slave unit 200.n having the maximal distance from the master unit 200, can be determined as follows:

$$V_i^{ref} \approx V_S - 2 \cdot R_c \cdot \left(i \cdot n - \frac{i^2 - i}{2}\right) \cdot I_L - R_s \cdot \left(i \cdot n - \frac{i^2 - i}{2}\right) \cdot I_L$$

Referring now to FIG. 9b, the reference voltage potential drop $V_p^{pos}$, which is measured by the slave unit 200.p, where $1 \le p \le k$, can be determined as follows:

$$\begin{aligned} V_p^{pos} &\approx V_S - 2 \cdot R_c \cdot \left(p \cdot n - \frac{p^2 + p}{2}\right) \cdot I_L - R_s \cdot \left(p \cdot n - \frac{p^2 + p}{2}\right) \cdot \\ & \quad I_L - 2 \cdot p \cdot R_c \cdot I_H - p \cdot R_s \cdot I_H \\ &= V_S - (2 \cdot R_c + R_s) \cdot \left(p \cdot n - \frac{p^2 + p}{2}\right) \cdot I_L - (2 \cdot R_c + R_s) \cdot p \cdot I_H \end{aligned}$$

where slave unit 200.k is selected to operate in high-power mode, where $1 \le k \le n$ and n is the total number of slave units 200.1 to 200.n.

The reference voltage potential drop $V_q^{pos}$, which is measured by the slave unit 200.q, where $k+1 \le q \le n$, can be determined as follows $$\begin{aligned} V_q^{pos} &\approx V_S - 2 \cdot R_c \cdot \left(i \cdot n - \frac{q^2 + q}{2} + (q-k)\right) \cdot I_L - R_s \cdot \\ & \quad \left(q \cdot n - \frac{q^2 + q}{2} + (q-k)\right) \cdot I_L - 2 \cdot k \cdot R_c \cdot I_H - k \cdot R_s \cdot I_H \\ &= V_S - (2 \cdot R_c + R_s) \cdot \left(i \cdot n - \frac{q^2 + q}{2} + (q-k)\right) \cdot I_L - \\ & \quad (2 \cdot R_c + R_s) \cdot k \cdot I_H \end{aligned}$$

where slave unit 200.k is selected to operate in high-power mode, where $1 \le k \le n$ and n is the total number of slave units 200.1 to 200.n.

Hence,

The relative voltage potential drop $\Delta V_i$ is obtained by determining a difference of the measured voltage potential drops as follows:

$$\Delta V_i \sim \begin{cases} i \cdot \left(R_c + \frac{1}{2} R_s\right) & 1 \le i \le k \\ k \cdot \left(R_c + \frac{1}{2} R_s\right) & k+1 \le i \le n \end{cases}$$

where $1 \le i \le k$, and $$\begin{aligned} \Delta V_i &= V_i^{ref} - V_i^{pos} \\ &= 2 \cdot i \cdot \left(R_c + \frac{1}{2} R_s\right) \cdot (I_H - I_L) \end{aligned}$$

where $k+1 \le i \le n$.

This means that $$\Delta V_i = V_i^{ref} - V_i^{pos}$$
$$= 2 \cdot k \cdot \left(R_c + \frac{1}{2}R_s\right) \cdot (I_H - I_L)$$

and $$\Delta V_i = \begin{cases} 2 \cdot i \cdot \left(R_c + \frac{1}{2}R_s\right) \cdot (I_H - I_L) & 1 \leq i \leq k \\ 2 \cdot k \cdot \left(R_c + \frac{1}{2}R_s\right) \cdot (I_H - I_L) & k+1 \leq i \leq n \end{cases}$$

when assuming that $I_H \gg I_L$.

Hence, $$\Delta V_i \approx \begin{cases} 2 \cdot i \cdot \left(R_c + \frac{1}{2}R_s\right) \cdot I_H & 1 \leq i \leq k \\ 2 \cdot k \cdot \left(R_c + \frac{1}{2}R_s\right) \cdot I_H & k+1 \leq i \leq n \end{cases}$$

wherein k is a constant for each measurement cycle.

The shunt resistance increases the distance between the levels of the relative voltage potential drop $\Delta V_i$.

It should be noted that the above exemplified auto-addressing procedures may be performed using the voltage adjustable power source 130 supplying a direct current or an alternating current having in particular a predefined frequency. In the latter case, the voltage measurement is performed at the slave units 200.1 to 200.n with respect to the predefined frequency of the alternating current supplied by the voltage adjustable power source 130. More particularly, the voltage potential drop measurements in high-power mode may be performed using alternating current. The use of an alternating current supplied by the voltage adjustable power source 130 may be more robust regarding noise and disturbance signals and may further reduce the requirements for measuring accuracy of the circuitry for measuring the voltage potential drops including in particular the voltage potential drop measurement unit 240. The above teaching enables the skilled person to implement the above exemplified auto-addressing procedures using direct current or alternating current supplied by the current adjustable power source 135.

Figure 10:
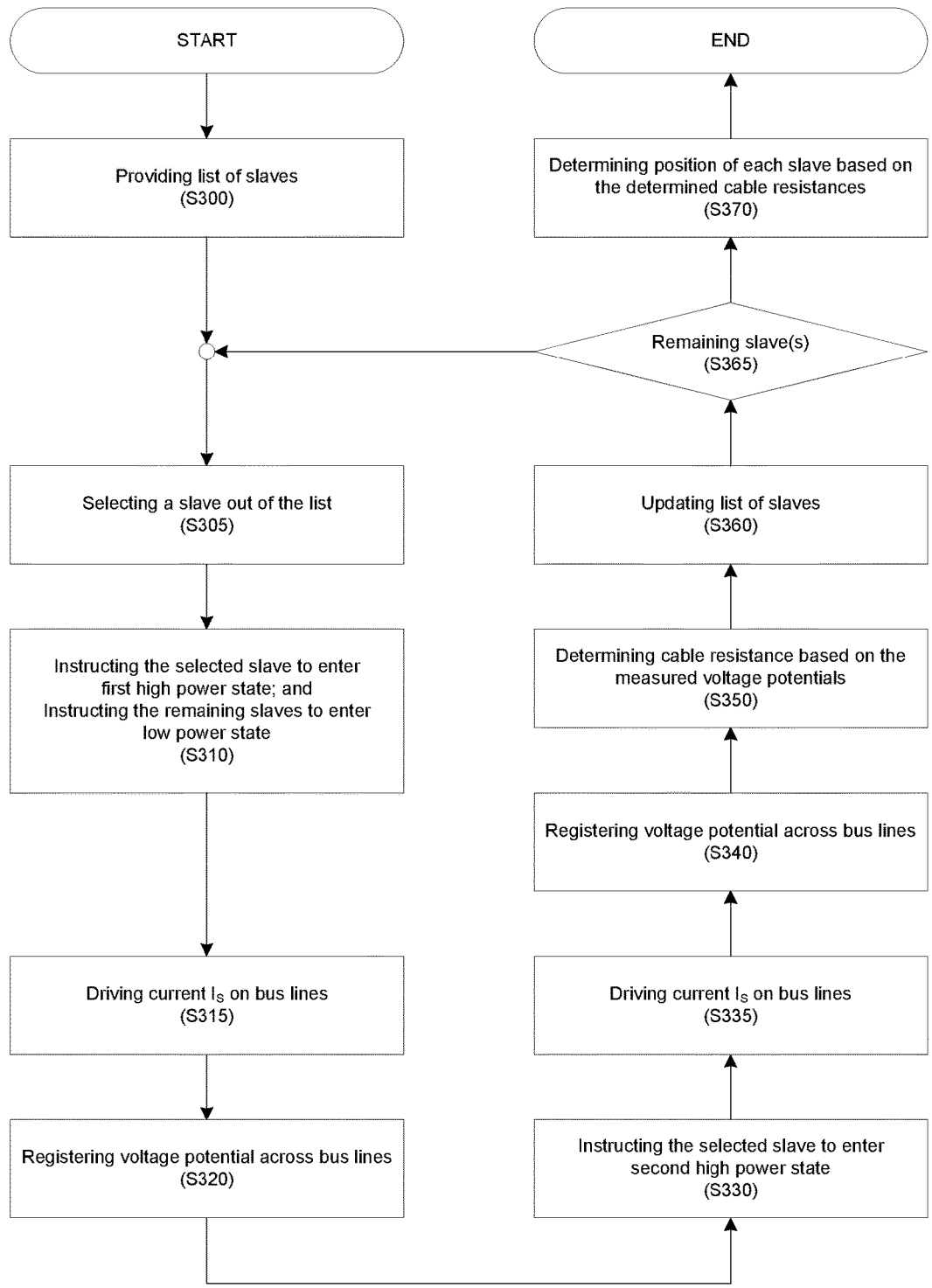
FIG. 10 schematically illustrates a flow diagram of a further method for determining the relative arrangement/position of slave units along a stub bus of a communication network according to an example of the present invention.

The auto-addressing procedure according to another embodiment of the present application will be further described with regard to FIG. 10, which schematically illustrates a flow diagram of a further method for determining the relative arrangement/position of slave units along a stub bus of a communication network. The auto-addressing procedure is controlled by the master unit, which is arranged at one end of the stub bus, to which an arbitrary number of slave units is connected. The auto-addressing procedure will be further described with reference to FIG. 11a, which schematically illustrates a block diagram of a master unit 100 according to an example of the present application, and with reference to FIGS. 11b to 11d, which schematically illustrates a block diagram of any slave unit 200.1 to 200.n according to an example of the present application.

Figure 11B:
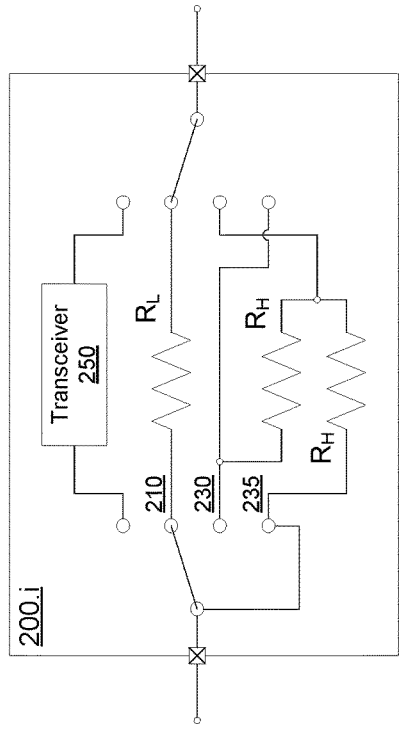
FIGS. 11b to 11d schematically illustrate block diagrams of a slave unit according to an example of the present application.
Figure 11D:
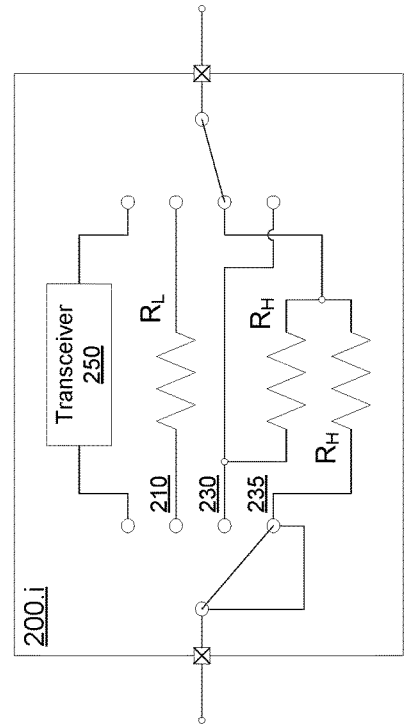
Figure 11A:
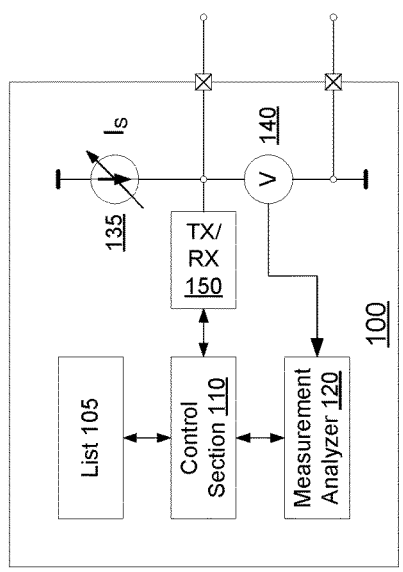
FIG. 11a schematically illustrates a block diagram of a master unit 100 according to an example of the present application.

The master unit 100 according to an example of the present application as exemplified in FIG. 11a comprises a current adjustable power source 135 and a transceiver 150 for communication network on a two wire stub bus for data communication between the master unit 100 and slave units 200.1 to 200.n connected to the stub bus. The master unit 100 further comprises a voltage potential drop measurement unit 140, a control section 110, which is connected to the transceiver for instructing the slave units 200.1 to 200.n, a measurement data analyzer section 120 and at least a list of slave units 105 for maintaining information about the slave units 200.1 to 200.n.

Figure 11C:
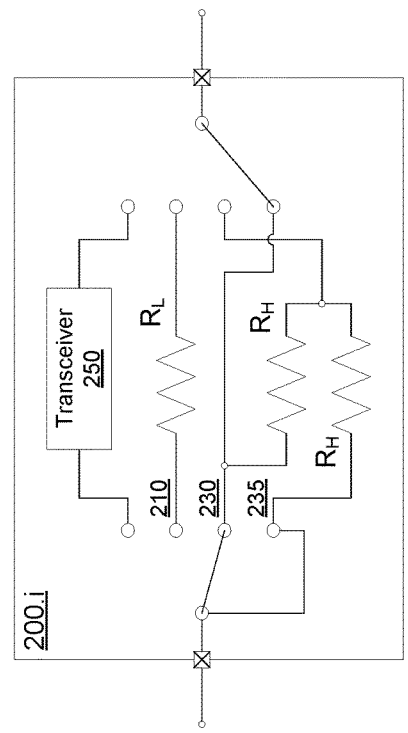

Each slave unit 200.1 to 200.n according to an example of the present application as exemplified in FIGS. 11b to 11d is instructable by the master unit 100 to operate in a low-power mode, a first high-power mode and a second high-power mode. A slave unit being instructed to operate in the low-power mode, draws a low-power current from the power supply line, which is smaller than high-power currents, which are drawn by the slave unit being instructed to operate in one of the high-power modes. The switchable effective resistances of the slave units 200.1 to 200.n differs in the different power modes. The voltage potential drops are measured across the different effective resistances switchable in accordance with the respective (low, first high and second high) power modes.

In an example, the low-power mode is schematically illustrated by a switchable resistor $R_L$ 210 as schematically shown in FIG. 11b. The first high-power mode is schematically illustrated by a switchable interconnection 220 of two resistor $R_H$ in a parallel circuit as schematically shown in FIG. 11c. The second high-power mode is schematically illustrated by a switchable interconnection 230 of the two resistor $R_H$ in an in-series circuit as schematically shown in FIG. 11d. The resistor $R_L$ 210 should be understood to have a higher effective resistance than the resistor $R_H$ 220. The first and the second high-power modes have a fixed effective resistance ratio of 4. Each slave unit 200.1 to 200.n further comprises a transceiver 250 for receiving instructions from the master unit 100.

Referring back to FIG. 10, a list of slave units connected to the bus is provided/maintained at a master unit 100, in an operation S300. The list of slave units comprises all slave units connected to the bus. Initially, the arrangement/positions of slave units along the bus is/are unknown. A slave unit, which arrangement/position along the bus is unknown, will be referred to as undetected or "unpositioned".

In an operation S305, an undetected slave unit is selected from the list of slave units.

In an operation S310, the all slave units except the selected one are instructed by the master unit 100 to enter the low-power mode and the selected slave unit is instructed by the master unit 100 to enter the first high-power mode.

In an operation S315, a predefined current $I_s$ is driven by the current adjustable power source 135 on the power line of the bus. The current adjustable power source 135 may be controlled by the master unit 100 to drive the predefined current $I_s$.

In an operation S320, a reference voltage potential drop is determined by the voltage potential drop measurement unit 140 across the power line and the ground line of the bus during all slave units except the selected one operating in the low-power mode and the selected slave unit operating in the first high-power mode. The voltage potential drop measurement unit 140 reports the measured reference voltage potential drop to the measurement data analyzer section 120.

In an operation S330, the selected slave unit is instructed by the master unit 100 to enter the first high-power mode.

In an operation S335, the predefined current $I_s$ is driven by the current adjustable power source 135 on the power line of the bus.

In an operation S340, a positioning voltage potential drop is determined by the voltage potential drop measurement unit 140 across the power line and the ground line of the bus during all slave units except the selected one operating in the low-power mode and the selected slave unit operating in the first high-power mode. The voltage potential drop measurement unit 140 reports the measured positioning voltage potential drop to the measurement data analyzer section 120.

In an operation S350, a cable resistance is determined by the measurement data analyzer section 120 based on a relative voltage potential, which is in turn determined from the measured drop the reference voltage potential drop and the measured positioning voltage potential drop.

In an operation S360, the list of slave units is updated with respect to the selected slave unit. For instance, the selected slave unit is removed from the list of slave units or the selected slave unit is indicated as being detected in the list of slave units such that the selected slave unit will be ignored in the further process of the auto-addressing procedure.

In an operation S365, the master unit 100 determines whether or not remaining slave units with unknown position/arrangement are still present. If there are remaining undetected slave units, the auto-addressing procedure return to the operation S305 and iterates the auto-addressing procedure with selecting a next slave unit from the list of slave units. Otherwise, if all slave units have been selected in previous iterations, the auto-addressing procedure continues with an operation S370, in which the relative arrangement/positions of the slave units connected to the bus are determined from the cable resistances determined for each slave unit.

Figure 12A:
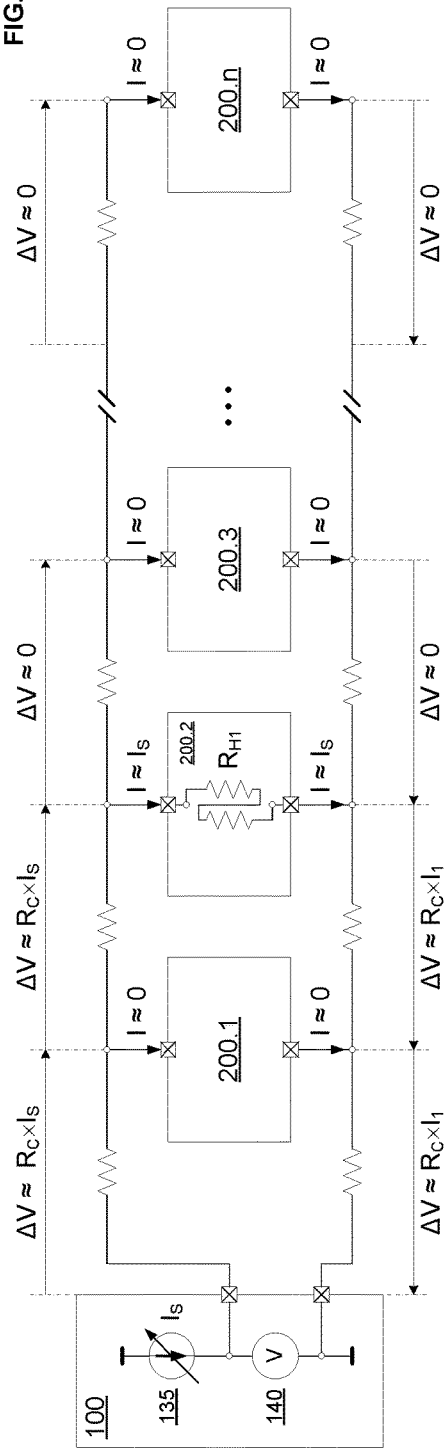
FIG. 12a schematically illustrates a block diagram of a communication network with slave units operating in low-power mode except a selected one operating in a first high-power mode according to an example of the present application.

The reference voltage potential drop measurement performed at an exemplarily selected slave unit 200.2 will be more fully described with reference to FIG. 12a, which schematically illustrates a block diagram of a communication network with slave units operating in low-power mode except a selected one operating in a first high-power mode according to an example of the present application.

As described above, the master unit 100 instructs all slave units expect a selected one to enter the low-power mode and instructs the selected slave unit to enter the first high-power mode. For the sake of example, the slave unit 200.2 is the selected one.

The reference voltage potential drop $V_2^{ref}$, which is measured at the master node 100 across the power line and the ground line of the bus, can be determined as follows:

$$V_2^{ref} \approx 2 \cdot R_c \cdot I_S + R_{H1} \cdot I_S + 2 \cdot R_c \cdot I_S$$

When assuming that current flowing though the slave units operating in the low-power mode can be substantially neglected in view of the current flowing through the selected slave unit operating in the first high-power mode and wherein $I_s$ is the current supplied by the current adjustable power source 135, $R_c$ is the resistance of a line section of the power supply line or the ground line between two neighboring units (e.g. between the master unit 100 and the first slave unit 200.1 or between neighboring slave unit 200.i and 200.i+1) and $R_{H1}$ is the effective resistance in the first high-power mode.

More generally, the reference voltage potential drop $V_i^{ref}$, which is measured at the master node 100 across the power line and the ground line of the bus in response to all slave units operating in low-power mode except a slave unit 200.i operating in the first high-power mode, can be determined as follows:

$$V_i^{ref} \approx i \cdot R_c \cdot I_S + R_{H1} \cdot I_S + i \cdot R_c \cdot I_S$$

$$= (2 \cdot i \cdot R_c + R_{H1}) \cdot I_S$$

$$= (2 \cdot i \cdot R_c + f_H \cdot R_B) \cdot I_S$$

wherein the effective $R_{H1} = f_H \cdot R_B$, $f_H$ is a scaling factor with respect to an effective base resistance $R_B$.

Referring back to FIGS. 9b to 9c illustratively showing block diagrams of an exemplary slave unit 200.i, the scaling factor $f_H$ may be $f_H = 4$.

Figure 12B:
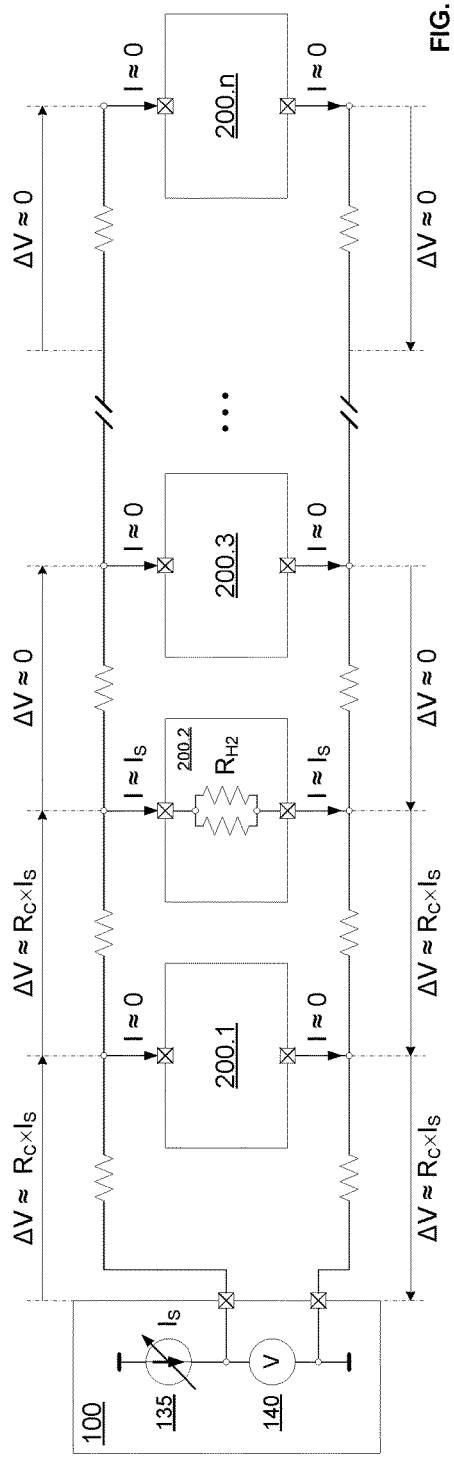
FIG. 12b schematically illustrates a block diagram of a communication network with slave units operating in low-power mode except a selected one operating in a second high-power mode according to an example of the present application.

The positioning voltage potential drop measurement performed at an exemplarily selected slave unit 200.2 will be more fully described with reference to FIG. 12b, which schematically illustrates a block diagram of a communication network with slave units operating in low-power mode except a selected one operating in a second high-power mode according to an example of the present application.

As described above, the master unit 100 instructs all slave units expect a selected one to enter the low-power mode and instructs the selected slave unit to enter the second high-power mode. For the sake of example, the slave unit 200.2 is the selected one.

The positioning voltage potential drop $V_2^{pos}$, which is measured at the master node 100 across the power line and the ground line of the bus, can be determined as follows:

$$V_2^{pos} \approx 2 \cdot R_c \cdot I_S + R_{H2} \cdot I_S + 2 \cdot R_c \cdot I_S$$

When assuming that current flowing though the slave units operating in the low-power mode can be substantially neglected in view of the current flowing through the selected slave unit operating in the first high-power mode and wherein $I_s$ is the current supplied by the current adjustable power source 135, $R_c$ is the resistance of a line section of the power supply line or the ground line between two neighboring units (e.g. between the master unit 100 and the first slave unit 200.1 or between neighboring slave unit 200.i and 200.i+1) and $R_{H2}$ is the effective resistance in the second high-power mode.

More generally, the positioning voltage potential drop $V_i^{pos}$, which is measured at the master node 100 across the power line and the ground line of the bus in response to all slave units operating in low-power mode except a slave unit 200.i operating in the first high-power mode, can be determined as follows:

$$V_i^{pos} \approx i \cdot R_c \cdot I_S + R_{H2} \cdot I_S + i \cdot R_c \cdot I_S$$

$$= (2 \cdot i \cdot R_c + R_{H2}) \cdot I_S$$

$$= (2 \cdot i \cdot R_c + R_B) \cdot I_S$$

wherein the effective base resistance $R_B$ is equal to the effective resistance $R_{H2}$ of the slave unit 200.i operating in the second high-power mode, $R_B = R_{H2}$.

The relative voltage potential drop $\Delta V_i$ determined based on a difference of the measured voltage potential drops allows to conclude the cable resistance between master unit 100 (and the current adjustable power source 135 thereof) and the respective slave unit 200.i at which the measurements have been performed. The relative voltage potential drop $\Delta V_i$ denotes as follows:

$$\Delta V_i = f_H \cdot V_i^{pos} - V_i^{ref}$$

$$= f_H (2 \cdot i \cdot R_c + R_B) \cdot I_S - (2 \cdot i \cdot R_c + f_H \cdot R_B) \cdot I_S$$

$$= 2 \cdot i \cdot (f_H - 1) \cdot R_c \cdot I_S$$

where the effective resistance of the slave node 200.$i$ in the first high-power mode is $R_{H1}=f_H \cdot R_B$, the effective resistance of the slave node 200.$i$ in the second high-power mode is $R_{H2}=R_B$, $f_H$ is the scaling factor, and $R_B$ is the effective base resistance.

Figure 12C:
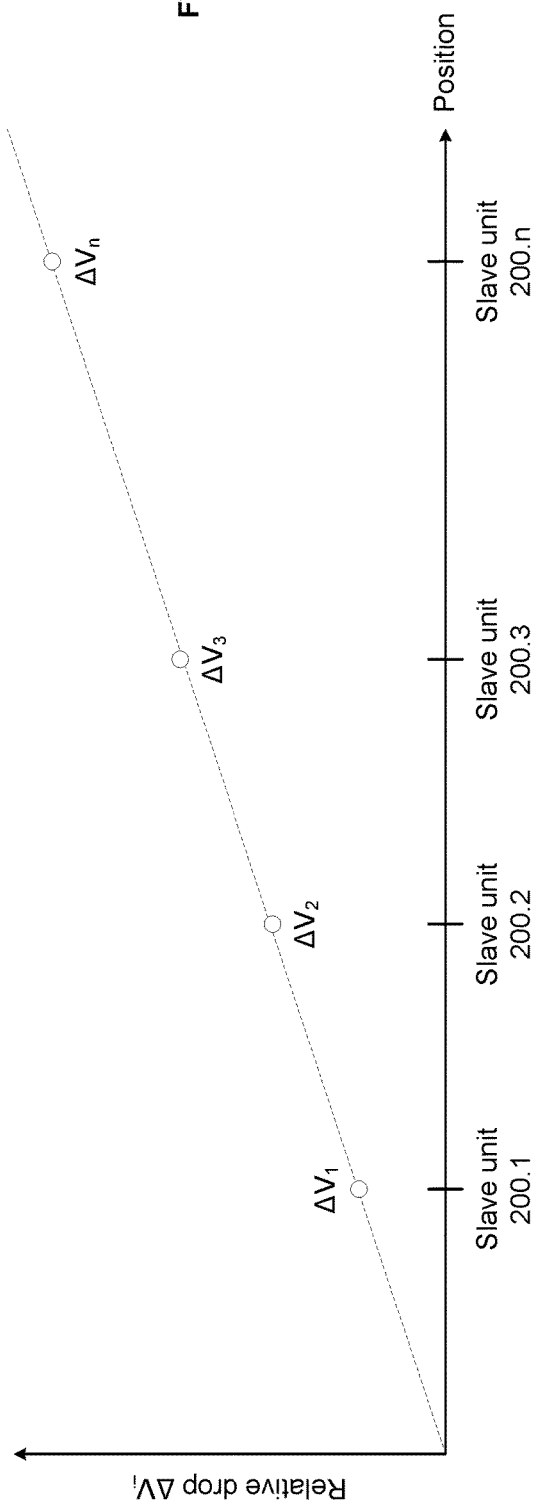
FIG. 12c schematically illustrates a diagram schematically illustrating the course of determined relative voltage potential drops in accordance with the examples of FIGS. 12a and 12b.

Hence, $$\Delta V_i \sim i \cdot R_c, \ 1 \leq i \leq n$$

as schematically illustrated in FIG. 12c.

Therefore, the relative positions/arrangement of the slave units 200.$i$ (1≤$i$≤$n$) can be determined by analyzing the levels of the relative voltage potential drop $\Delta V_i$, which is substantially proportional to the position index $i$.

As the skilled person may understand from the above description, the resistance of the power supply line and/or the ground line may be substantially low. As shown above with respect to the above examples, the relative positions/arrangement of the slave units 200.$i$ (1≤$i$≤$n$) can be determined by analyzing the levels of the relative voltage potential drop $\Delta V_i$, which is in turn substantially proportional to the resistance $R_c$, which denotes the resistance of a line section of the power supply line or the ground line between two neighboring units (e.g. between the master unit 100 and the first slave unit 200.1 or between neighboring slave unit 200.$i$ and 200.$i$+1). This means that the higher the resistance $R_c$ the more distinct are the levels of the relative voltage potential drop $\Delta V_i$ obtained from the measured voltage potential drops. As further shown above, the relative voltage potential drop $\Delta V_i$ is proportional to the scaling factor $f_H$ minus one:

$$\Delta V_i \sim i \cdot (f_H - 1), \ 1 \leq i \leq n$$

Increasing the scaling factor $f_H$, which denotes the ratio of the effective resistances in the first and second high-power modes, enables increasing the distance between the levels of the relative voltage potential drop $\Delta V_i$. Further, the integration of a shunt resistance allows likewise for increasing the level distances.

Figure 13:
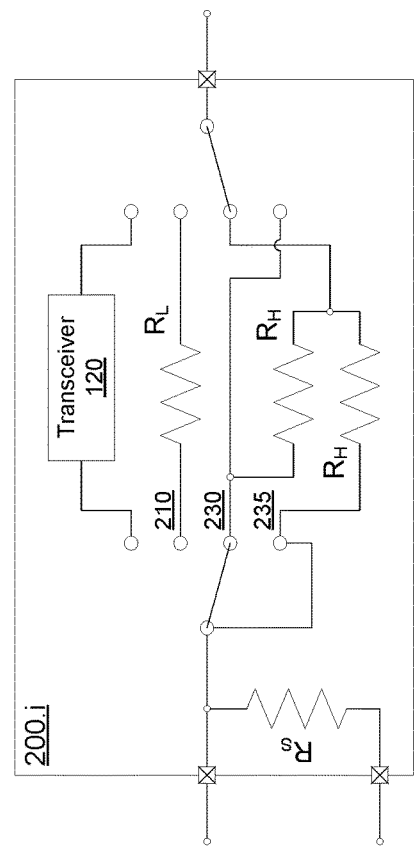
FIG. 13 schematically illustrates a block diagram of a slave unit with a shunt resistance according to a further example of the present invention.

Referring to FIG. 13 now, each slave unit 200.$i$ according to an example of the present application comprises a shunt resistance $R_s$, which is for instance arranged in series with the power line. The shunt resistance $R_s$ is arranged downstream to the effective resistances, across which the voltage potential drops are measured. Accordingly, the slave unit 200.$i$ has an input terminal and an output terminal for connecting to the power line. The shunt resistance $R_s$ is connected between the input terminal and the output terminal. Alternatively or additionally, a shunt resistance $R_s$ may be arranged in series with the ground line (not shown). The statements above with respect to the shunt resistance $R_s$ connected in series with the power line apply analogously to a shunt resistance $R_s$ connected in series with the ground line.

Referring to FIG. 14a now, the reference voltage potential drop $V_i^{ref}$, which is measured at the master node 100 across the power line and the ground line of the bus in response to all slave units operating in low-power mode except a slave unit 200.$i$ operating in the first high-power mode, can be determined as follows:

$$V_i^{ref} \approx i \cdot (R_c + R_S) \cdot I_S + R_{H1} \cdot I_S + i \cdot R_c \cdot I_S$$

$$= (2 \cdot i \cdot R_c + i \cdot R_S + R_{H1}) \cdot I_S$$

$$= (2 \cdot i \cdot R_c + i \cdot R_S + f_H \cdot R_B) \cdot I_S$$

wherein the effective $R_{H1}=f_H \cdot R_B$, $f_H$ is a scaling factor with respect to an effective base resistance $R_B$.

Referring to FIG. 14b now, the positioning voltage potential drop $V_i^{pos}$, which is measured at the master node 100 across the power line and the ground line of the bus in response to all slave units operating in low-power mode except a slave unit 200.$i$ operating in the second high-power mode, can be determined as follows:

$$V_i^{pos} \approx i \cdot R_c \cdot (R_c + R_S) \cdot I_S + R_{H2} \cdot I_S + i \cdot R_c \cdot I_S$$

$$= (2 \cdot i \cdot R_c + i \cdot R_S + R_{H2}) \cdot I_S$$

$$= (2 \cdot i \cdot R_c + i \cdot R_S + R_B) \cdot I_S$$

wherein the effective base resistance $R_B$ is equal to the effective resistance $R_{H2}$ of the slave unit 200.$i$ operating in the second high-power mode, $R_B=R_{H2}$.

The relative voltage potential drop $\Delta V_i$ denotes as follows:

$$\Delta V_i = f_H \cdot V_i^{pos} - V_i^{ref}$$

$$= f_H \cdot (1 \cdot i \cdot R_c + i \cdot R_s + R_B) \cdot I_S - (2 \cdot i \cdot R_c + i \cdot R_s + f_H \cdot R_B) \cdot I_S$$

$$= ((f_H - 1) \cdot 2 \cdot i \cdot R_c + (f_H - 1) \cdot i \cdot R_s) \cdot I_S$$

$$= 2 \cdot i \cdot (f_H - 1) \cdot \left(R_c + \frac{1}{2} R_s\right) \cdot I_S$$

Hence, $$\Delta V_i \sim i \cdot \left(R_c + \frac{1}{2} R_s\right), \ 1 \leq i \leq n$$

The shunt resistance increases the distance between the levels of the relative voltage potential drop $\Delta V_i$.

It should be noted that the above exemplified auto-addressing procedures may be performed using the current adjustable power source 135 supplying a direct current or an alternating current having in particular a predefined frequency. In the latter case, the voltage measurement is performed at the master unit 100 with respect to the predefined frequency of the alternating current supplied by the current adjustable power source 135. More particularly, the voltage potential drop measurements in high-power mode may be performed using alternating current. The use of an alternating current supplied by the current adjustable power source 135 may be more robust regarding noise and disturbance signals and may further reduce the requirements for measuring accuracy of the circuitry for measuring the voltage potential drops including in particular the voltage potential drop measurement unit 140. The above teaching enables the skilled person to implement the above exemplified auto-addressing procedures using direct current or alternating current supplied by the current adjustable power source 135.

The above embodiments illustrate the basic concept of the present invention to determine the positioning of slave units connected along a stub bus based on a bus line resistance, which in turn is determined based on relative voltage potential drops determined in different power modes. The relative voltage potential drops enable a reliable determining of the small voltage drops due to low bus line resistance.

According to an aspect of the present application, a method and a system allowing for determining relative positions of a plurality of slave units connected to a stub bus with a master unit is provided. The stub bus comprises at least a power line and a ground line. Each slave unit is operable in different power modes, which are differentiated by effective resistances between the power line and the ground line. For each slave unit, a reference voltage potential drop ($V_i^{ref}$) is determined across the power line and the ground line while the slave units are operating in a first power mode. For each slave unit, a positioning voltage potential drop ($V_i^{pos}$) is determined across the power line and the ground line with regard to the one or more slave units while a selected slave unit of the plurality of slave units is operating in a second power mode. The relative positions of the plurality of slave units is determined based on relative voltage potential drops ($\Delta V_i$) obtained from the reference voltage potential drops ($V_i^{ref}$) and the positioning voltage potential drops ($V_i^{pos}$) of the respective slave units. According to an example, the operations conducted to determine the relative positions of a plurality of slave units is under control of the master unit, which is connected to one end of the stub bus.

In an example, the operations conducted to determine the relative positions of a plurality of slave units are under control of the master unit, which is connected to one end of the stub bus.

According to another aspect of the present application, each slave unit comprises a voltage potential drop measurement unit arranged to measure a voltage potential drop across the power line and the ground line. the master unit is configured to instruct each slave unit to measure the reference voltage potential drop ($V_i^{ref}$) while each the slave unit is operating in a low-power mode. The master unit is further configured to instruct each slave unit to measure the positioning voltage potential drop while each slave unit is operating in a low-power mode except a selected slave unit operating in a high-power mode. The master unit is arranged to collect the relative voltage potential drops ($\Delta V_i$) for each slave unit. Each relative voltage potential drop ($\Delta V_i$) is based on the reference voltage potential drop ($V_i^{ref}$) and positioning voltage potential drop ($V_i^{pos}$) measured by the respective slave unit. The master unit is configured to detect the relative positions of one or more slave units based on the collected relative voltage potential drops.

In an example, the master unit is arranged to receive the relative voltage potential drops ($\Delta V_i$) from the slave units. Each of the slave unit is arranged to determine the relative voltage potential drop ($\Delta V_i$) based on the measured reference voltage potential drop ($V_i^{ref}$) and the measured positioning voltage potential drop ($V_i^{pos}$). In an example, each slave unit is arranged to determine the relative voltage potential drop ($\Delta V_i$) by determining a difference between the measured positioning voltage potential drop ($V_i^{pos}$) and the measured reference voltage potential drop ($V_i^{ref}$). In an example, the master unit is arranged to maintain a list of the plurality of slave units connected to the stub bus. The list indicates with respect to each slave unit whether or not the relative position along the stub bus is detected. Detecting the relative positions of one or more slave units based on the collected relative voltage potential drops ($\Delta V_i$) is repeated as long as the relative position of at least one slave unit is undetected. The collected relative voltage potential drops ($\Delta V_i$) is obtained by instructing each slave unit to measure the reference voltage potential drop ($V_i^{ref}$) and the positioning voltage potential drop ($V_i^{pos}$) with a newly selected slave unit out of the slave units being undetected. In an example, the master unit comprises a voltage adjustable power source arranged to apply a predefined voltage ($V_s$) across the power line and ground line. The master unit is arranged to drive the predefined voltage ($V_s$) on the power line during measuring the reference voltage potential drops ($V_i^{ref}$) and the positioning voltage potential drops ($V_i^{pos}$). In an example, the predefined voltage ($V_s$) is a predefined direct current voltage ($V_s$) or the predefined voltage ($V_s$) is a predefined alternating voltage ($V_s$) having a predefined frequency.

According to a further aspect of the present application, the master unit comprises a voltage potential drop measurement unit provided to measure a voltage potential drop across the power line and ground line. The master unit is configured to measure the reference voltage potential drop ($V_i^{ref}$) while each the slave unit operating in a low-power mode except a selected slave unit operating in a first high-power mode. The master unit is configured to measure the positioning voltage potential drop ($V_i^{pos}$) while each slave unit is operating in a low-power mode except the selected slave unit operating in a second high-power mode. The master unit is configured to determine a relative voltage potential drop ($\Delta V_k$) for the selected slave unit. The master unit is configured to detect the relative positions of the plurality of slave units based on the relative voltage potential drops ($\Delta V_i$) determined for each slave unit (200.$i$).

In an example, the master unit is arranged to maintain a list of the plurality of slave units connected to the stub bus. The list indicates whether or not a slave unit out of the plurality of slave units has been already selected once. The master unit is arranged to select a slave unit, which has not been already selected once, out of the plurality of slave units. The determining of the relative voltage potential drop ($\Delta V_k$) is repeated for the selected slave unit. The master unit is arranged to collect the relative voltage potential drops ($\Delta V_k$) of the selected slave unit. The relative positions of the plurality of slave units is detected by the master unit once the relative voltage potential drops ($\Delta V_i$) have been determined for each slave unit. In an example, the master unit comprises a current adjustable power source arranged to apply a predefined current ($I_s$) across the power line and ground line. The master unit is arranged to drive the predefined current ($I_s$) on the power line during measuring the reference voltage potential drop ($V_i^{ref}$) and the positioning voltage potential drop ($V_i^{pos}$). In an example, the predefined current ($I_s$) is a direct current or the predefined current ($I_s$) is an alternating current having a predefined frequency.

According to a yet another aspect of the present application, a system comprising a plurality of slave units connected to a stub bus with a master unit is provided. The system is enabled to determine relative positions of plurality of slave units along the stub bus. The stub bus comprises at least a power line and a ground line. Each slave unit configured to operate in different power modes, which are differentiated by effective resistances between the power line and the ground line. the system configured to determine for each slave unit a reference voltage potential drop ($V_i^{ref}$) across the power line and the ground line while the slave units are operating in a first power mode; to determine for each slave unit a positioning voltage potential drop ($V_i^{pos}$) across the power line and the ground line with regard to the one or more slave units while a selected slave units of the plurality of slave units is operating in a second power mode; and to determine relative positions of the plurality of slave units based on relative voltage potential drops ($\Delta V_i$) obtained from the reference voltage potential drops ($V_i^{ref}$) and the positioning voltage potential drops ($V_i^{pos}$).

In an example, each slave unit comprises a voltage potential drop measurement unit arranged to measure a voltage potential drop across the power line and the ground line. The master unit is arranged to instruct each slave unit to measure the reference voltage potential drop ($V_i^{ref}$) while each the slave unit operating in a low-power mode. The master unit is arranged instruct each slave unit to measure the positioning voltage potential drop ($V_i^{pos}$) while each slave unit operating in a low-power mode expect a selected slave unit operating in a high-power mode. The master unit is arranged to collect relative voltage potential drops ($\Delta V_i$) for each slave unit. Each relative voltage potential drop ($\Delta V_i$) is based on the reference voltage potential drop ($V_i^{ref}$) and positioning voltage potential drop ($V_i^{pos}$) measured by the respective slave unit. The master unit is arranged to detect the relative positions of one or more slave units based on the collected relative voltage potential drops ($\Delta V_i$). In an example, each the master unit is arranged to receive the relative voltage potential drops ($\Delta V_i$) from the slave units. Each of the slave units is arranged to determine the relative voltage potential drop ($\Delta V_i$) based on the measured reference voltage potential drop ($V_i^{ref}$) and the measured positioning voltage potential drop ($V_i^{pos}$).

In an example, the master unit comprises a voltage potential drop measurement unit arranged to measure a voltage potential drop across the power line and ground line. The master unit is arranged to measure the reference voltage potential drop ($V_i^{ref}$) while each the slave unit operating in a low-power mode except a selected slave unit operating in a first high-power mode. The master unit is arranged to measure the positioning voltage potential drop ($V_i^{pos}$) while each slave unit is operating in a low-power mode except the selected slave unit operating in a second high-power mode. The master unit is arranged to determine a relative voltage potential drop ($\Delta V_k$) for the selected slave unit. The master unit is arranged to detect the relative positions of the plurality of slave units based on the relative voltage potential drops ($\Delta V_i$) determined for each slave unit. In an example, the master unit is arranged to maintain a list of the plurality of slave units connected to the stub bus. The list indicates whether or not a slave unit out of the plurality of slave units has been already selected once. The master unit is arranged to select a slave unit, which has not been already selected once, out of the plurality of slave units. The master unit is arranged to repeat the determining of the relative voltage potential drop ($\Delta V_k$) for the selected slave unit. The master unit is arranged to collect the relative voltage potential drops ($\Delta V_k$) of the selected slave unit. The relative positions of the plurality of slave units is detected by the master unit once the relative voltage potential drops ($\Delta V_i$) have been determined for each slave unit.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To illustrate clearly this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

The invention claimed is:

1. A method for determining relative positions of a plurality of slave units connected to a stub bus with a master unit, wherein the stub bus comprises at least a power line and a ground line, wherein each slave unit is operable in different power modes, which are differentiated by effective resistances between the power line and the ground line, the method comprising:
   determining for each slave unit a reference voltage potential drop across the power line and the ground line while the slave units are operating in a first power mode;
   determining a positioning voltage potential drop across the power line and the ground line with regard to the one or more slave units while a selected slave unit of the plurality of slave units is operating in a second power mode; and
   determining relative positions of the plurality of slave units based on relative voltage potential drops obtained from the positioning voltage potential drops and the reference voltage potential drops;
   wherein each slave unit comprises a voltage potential drop measurement unit arranged to measure a voltage potential drop across the power line and the ground line, the method comprising:
   the master unit, instructing each slave unit to measure the reference voltage potential drop while each the slave unit is operating in a low-power mode;
   the master unit, instructing each slave unit to measure the positioning voltage potential drop across the power line and the ground line while each slave unit is operating in a low-power mode except a selected slave unit operating in a high-power mode; and
   the master unit, collecting relative voltage potential drops for each slave unit, wherein each relative voltage potential drop is based on the reference voltage potential drop and positioning voltage potential drop measured by the respective slave unit; and
   the master unit, detecting the relative positions of one or more slave units based on the collected relative voltage potential drops.

2. The method of claim 1, wherein the determining operations conducted to determine the relative positions of a plurality of slave units are under control of the master unit, which is connected to one end of the stub bus.

3. The method of claim 1, further comprising the master unit, receiving the relative voltage potential drops from the slave units, each of which is arranged to determine the relative voltage potential drop based on the measured reference voltage potential drop and the measured positioning voltage potential drop.

4. The method of claim 1, further comprising each slave unit, determining the relative voltage potential drops by determining a difference between the measured positioning voltage potential drop and the measured reference voltage potential drop.

5. The method of claim 1, wherein the master unit is arranged to maintain a list of the plurality of slave units connected to the stub bus, wherein the list indicates with respect to each slave unit whether or not the relative position along the stub bus is detected, the method comprising:
   repeating detecting the relative positions of one or more slave units based on the collected relative voltage potential drops as long as the relative position of at least one slave unit is undetected;
   wherein the collected relative voltage potential drops is obtained by instructing each slave unit to measure the reference voltage potential drop and the positioning voltage potential drop with a newly selected slave unit out of the slave units being undetected.

6. The method according to claim 1, wherein the master unit comprises a voltage adjustable power source arranged to apply a predefined voltage across the power line and ground line, the method comprising:
   the master unit, driving the predefined voltage on the power line during measuring the reference voltage potential drops and the positioning voltage potential drops.

7. The method according to claim 1, wherein the master unit comprises a voltage potential drop measurement unit arranged to measure a voltage potential drop across the power line and ground line, the method comprising:
   the master unit, measuring the reference voltage potential drop while each the slave unit operating in a low-power mode except a selected slave unit operating in a first high-power mode;
   the master unit, measuring the positioning voltage potential drop while each slave unit is operating in a low-power mode except the selected slave unit operating in a second high-power mode;
   the master unit, determining a relative voltage potential drop for the selected slave unit; and
   the master unit, detecting the relative positions of the plurality of slave units based on the relative voltage potential drops determined for each slave unit.

8. The method according to claim 7, wherein the master unit is arranged to maintain a list of the plurality of slave units connected to the stub bus, wherein the list indicates whether or not a slave unit out of the plurality of slave units has been already selected once, the method comprising:
   the master unit, selecting a slave unit, which has not been already selected once, out of the plurality of slave units;
   repeating the determining of the relative voltage potential drop for the selected slave unit; and
   collecting the relative voltage potential drops of the selected slave unit, wherein the relative positions of the plurality of slave units is detected by the master unit once the relative voltage potential drops have been determined for each slave unit.

9. The method according to claim 7, wherein the master unit comprises a current adjustable power source arranged to apply a predefined current across the power line and ground line, the method further comprising:
   the master unit, driving the predefined current on the power line during measuring the reference voltage potential drop and the positioning voltage potential drop.

10. A system comprising a plurality of slave units connected to a stub bus with a master unit, wherein the system is enabled to determine relative positions of plurality of slave units along the stub bus, wherein the stub bus comprises at least a power line and a ground line, wherein each slave unit configured to operate in different power modes, which are differentiated by effective resistances between the power line and the ground line, the system configured to:

determine for each slave unit a reference voltage potential drop across the power line and the ground line while the slave units are operating in a first power mode;

determine for each slave unit a positioning voltage potential drop across the power line and the ground line with regard to the one or more slave units while a selected slave units of the plurality of slave units is operating in a second power mode; and determine relative positions of the plurality of slave units based on relative voltage potential drops obtained from the reference voltage potential drops and the positioning voltage potential drops;

wherein each slave unit comprises a voltage potential drop measurement unit arranged to measure a voltage potential drop across the power line and the ground line, wherein the master unit is arranged to instruct each slave unit to measure the reference voltage potential drop while each the slave unit operating in a low-power mode;

wherein the master unit is arranged to instruct each slave unit to measure the positioning voltage potential drop while each slave unit operating in a low-power mode expect a selected slave unit operating in a high-power mode; and wherein the master unit is arranged to collect relative voltage potential drops for each slave unit wherein each relative voltage potential drop is based on the reference voltage potential drop and positioning voltage potential drop measured by the respective slave unit; and wherein the master unit is arranged to detect the relative positions of one or more slave units based on the collected relative voltage potential drops.

11. The system according to claim 10, wherein each the master unit is arranged to receive the relative voltage potential drops from the slave units, wherein each of the slave units is arranged to determine the relative voltage potential drop based on the measured reference voltage potential drop and the measured positioning voltage potential drop.

12. The system according to claim 10, wherein the master unit comprises a voltage potential drop measurement unit arranged to measure a voltage potential drop across the power line and ground line, wherein the master unit is arranged to measure the reference voltage potential drop while each the slave unit operating in a low-power mode except a selected slave unit operating in a first high-power mode;

wherein the master unit is arranged to measure the positioning voltage potential drop while each slave unit is operating in a low-power mode except the selected slave unit operating in a second high-power mode;

wherein the master unit is arranged to determine a relative voltage potential drop for the selected slave unit; and wherein the master unit is arranged to detect the relative positions of the plurality of slave units based on the relative voltage potential drops determined for each slave unit.

13. The system according to claim 12, wherein the master unit is arranged to maintain a list of the plurality of slave units connected to the stub bus, wherein the list indicates whether or not a slave unit out of the plurality of slave units has been already selected once, wherein the master unit is arranged to select a slave unit, which has not been already selected once, out of the plurality of slave units, wherein the master unit is arranged to repeat the determining of the relative voltage potential drop for the selected slave unit, wherein the master unit is arranged to collect the relative voltage potential drops of the selected slave unit, and wherein the relative positions of the plurality of slave units is detected by the master unit once the relative voltage potential drops have been determined for each slave unit.

* * * * *